(12) United States Patent
Siglock

(10) Patent No.: US 10,510,226 B2
(45) Date of Patent: Dec. 17, 2019

(54) METER SOCKET WITH TAMPER DETECTION ASSEMBLY

(71) Applicant: MILBANK MANUFACTURING CO., Kansas City, MO (US)

(72) Inventor: John V. Siglock, Kansas City, MO (US)

(73) Assignee: MILBANK MANUFACTURING CO., Kansas City, MO (US)

(*) Notice: Subject to any disclaimer, the term of this patent is extended or adjusted under 35 U.S.C. 154(b) by 0 days.

(21) Appl. No.: 16/176,000

(22) Filed: Oct. 31, 2018

(65) Prior Publication Data

US 2019/0139379 A1 May 9, 2019

Related U.S. Application Data

(60) Provisional application No. 62/581,248, filed on Nov. 3, 2017.

(51) Int. Cl.
| | |
|---|---|
| *G08B 13/06* | (2006.01) |
| *G01R 22/06* | (2006.01) |
| *G08B 13/189* | (2006.01) |
| *G08B 13/16* | (2006.01) |
| *G08B 25/06* | (2006.01) |
| *G08B 25/10* | (2006.01) |
| *H01R 13/66* | (2006.01) |

(52) U.S. Cl.
CPC .......... *G08B 13/06* (2013.01); *G01R 22/066* (2013.01); *G08B 13/1672* (2013.01); *G08B 13/1895* (2013.01); *G08B 25/06* (2013.01); *G08B 25/10* (2013.01); *H01R 13/6683* (2013.01); *H01R 13/6691* (2013.01)

(58) Field of Classification Search
CPC ............ G08B 13/06; G08B 13/1672; G08B 13/1895; G08B 25/06; G01R 22/066
USPC ........................................ 340/550
See application file for complete search history.

(56) References Cited

U.S. PATENT DOCUMENTS

| | | | |
|---|---|---|---|
| 4,016,429 A | 4/1977 | Vercellotti et al. | |
| 4,565,995 A * | 1/1986 | Stokes ............. | G01R 22/066 340/541 |
| 5,086,292 A | 2/1992 | Johnson et al. | |

(Continued)

OTHER PUBLICATIONS

International Search Report and Written Opinion for related application, PCT/US2018/058340, dated Feb. 6, 2019 (17 pgs).

*Primary Examiner* — John A Tweel, Jr.
(74) *Attorney, Agent, or Firm* — Stinson LLP

(57) ABSTRACT

A meter socket with a tamper detection assembly is disclosed. The tamper detection assembly may include a light sensor that enables the detection of tampering caused by an energy thief removing the cover of the meter socket enclosure and/or removing the meter from the meter socket in an effort to access the power supply connectors and steal electricity. The tamper detection assembly may also include an acoustic sensor that enables the detection of tampering caused by an energy thief drilling, cutting, hammering, bending or otherwise attempting to violate the integrity of the meter socket enclosure in an effort to access the power supply connectors and steal electricity. The tamper detection assembly is preferably mounted within a mounting block of the meter socket so as to provide a secure source of power and communications for the assembly.

45 Claims, 25 Drawing Sheets

(56) References Cited

U.S. PATENT DOCUMENTS

| | | | |
|---|---|---|---|
| 5,140,258 A * | 8/1992 | Bishop | G01R 11/24 324/110 |
| 5,590,179 A | 12/1996 | Shincovich et al. | |
| 6,275,168 B1 * | 8/2001 | Slater | G01R 22/00 324/110 |
| 7,503,800 B2 | 3/2009 | Siglock | |
| 7,785,137 B2 | 8/2010 | Porter et al. | |
| 7,850,483 B2 | 12/2010 | Siglock et al. | |
| 9,595,846 B2 | 3/2017 | Siglock et al. | |

\* cited by examiner

METER SOCKET WITH TAMPER DETECTION ASSEMBLY

CROSS-REFERENCE TO RELATED APPLICATIONS

This application is based on and claims priority to U.S. Provisional Application Ser. No. 62/581,248, filed on Nov. 3, 2017, which is incorporated herein by reference in its entirety.

STATEMENT REGARDING FEDERALLY SPONSORED RESEARCH OR DEVELOPMENT

Not applicable.

BACKGROUND OF THE INVENTION

A conventional meter box comprises an electric watt-hour meter installed within a meter socket. In a single-phase power system, the meter socket includes two power supply connectors that connect the power supply conductors to the meter and, similarly, two power load connectors that connect the power load conductors to the meter. In a three-phase power system, the meter socket includes three power supply connectors that connect the power supply conductors to the meter and, similarly, three power load connectors that connect the power load conductors to the meter. In both types of systems, electrical current flows from the electric power utility over the power supply conductors to the power supply connectors of the meter socket, through the meter, to the power load connectors of the meter socket and over the power load conductors to the customer premise.

In the United States, it is estimated that between one-half percent (0.5%) and three and one-half percent (3.5%) of electricity delivered by electric power utilities is lost to theft. In other countries with weaker governance factors, the rate of electricity theft is estimated to be as high as twenty percent (20%). There are a variety of ways in which energy thieves can tamper with different types of meter sockets and meters—both older electromechanical meters and newer electronic meters—in an effort to steal the electricity.

Meter sockets with older electromechanical meters can be tampered with in a number of ways. For example, energy thieves can attach magnets to the outside of the meter socket enclosure in order to interfere with the internal magnetic field and reduce the rotation of the disk within the meter. Energy thieves can also insert a device into the meter socket that acts as a brake to slow the meter from spinning. It is also possible to add dirt or liquid to cause rust in an effort to slow down the rotation of the meter. As yet another example, energy thieves can remove the meter from the meter socket and re-install the meter in an inverted position so that the meter runs backwards. Further, energy thieves can tap into the power supply at the power supply connectors of the meter socket before the electrical current flows through the meter in order to run large energy loads with un-metered power.

Some of the tampering methods available for electromechanical meters have been eliminated with the implementation of advanced metering infrastructure (AMI). AMI is an integrated system of electronic "smart" meters and communication networks that enables two-way communication between the electric power utility and the electronic meters. Many AMI meters contain sensors that detect unusual external electrical or magnetic fields, which eliminates the use of magnets as an effective tampering method. Also, the method of inverting the meter is not effective insofar as many AMI meters detect the removal of the meter from the power supply connectors of the meter socket and/or detect the reversed flow of electrical current. Upon detection of any of these tampering conditions, AMI meters may log the event and preferably send an alarm to the electric power utility over an established communication network when power is available, e.g., when the meter is installed back on the power supply connectors of the meter socket.

While many forms of tampering are no longer possible with AMI meters, there are still methods that energy thieves can employ to steal electricity. For example, the method of bypassing the meter by tapping into the power supply at the power supply connectors of the meter socket is possible not just for older electromechanical meters, but also for new AMI meters. As such, if energy thieves are able to gain access to the inside of the meter socket, whether by removing the cover of the meter socket enclosure or drilling a hole through the meter socket enclosure, it is possible to run large energy loads with un-metered power.

BRIEF SUMMARY OF THE INVENTION

In one aspect, the present invention is directed to a tamper detection assembly that includes a microprocessor connected to one or both of a light sensor and an acoustic sensor. The tamper detection assembly is preferably positioned within a meter socket, but could be positioned within the meter itself. With the use of a light sensor, the tamper detection assembly is able to detect tampering caused by an energy thief removing the cover of the meter socket enclosure, removing the meter from the meter socket, or otherwise creating an opening in the meter socket enclosure, in an effort to access the power supply connectors and steal electricity. With the use of an acoustic sensor, the tamper detection assembly is able to detect tampering caused by an energy thief drilling, cutting, hammering, bending or otherwise attempting to violate the integrity of the meter socket enclosure in an effort to access the power supply connectors and steal electricity. Any detected tamper event may be reported to the electric power utility or even to the power user using any form of wireless communication or power line carrier communication known in the art.

In another aspect, the present invention is directed to a meter socket with an electronic device, such as the tamper detection assembly, mounted within the mounting block of the meter socket so as to provide a secure source of power and communications for the electronic device. Because an AMI meter reports loss of power to the electric power utility, and because the AMI meter must be removed to access the mounting block of the meter socket, any attempt to remove the mounting block would be reported to the electric power utility. Thus, mounting an electronic device within the mounting block of the meter socket provides a secure power connection insofar as the power and ground connections are inaccessible without detection.

BRIEF DESCRIPTION OF THE DRAWINGS

Various exemplary embodiments of the present invention are described in detail below with reference to the attached drawing figures, wherein.

DETAILED DESCRIPTION OF EXEMPLARY EMBODIMENTS

Figure 1A:
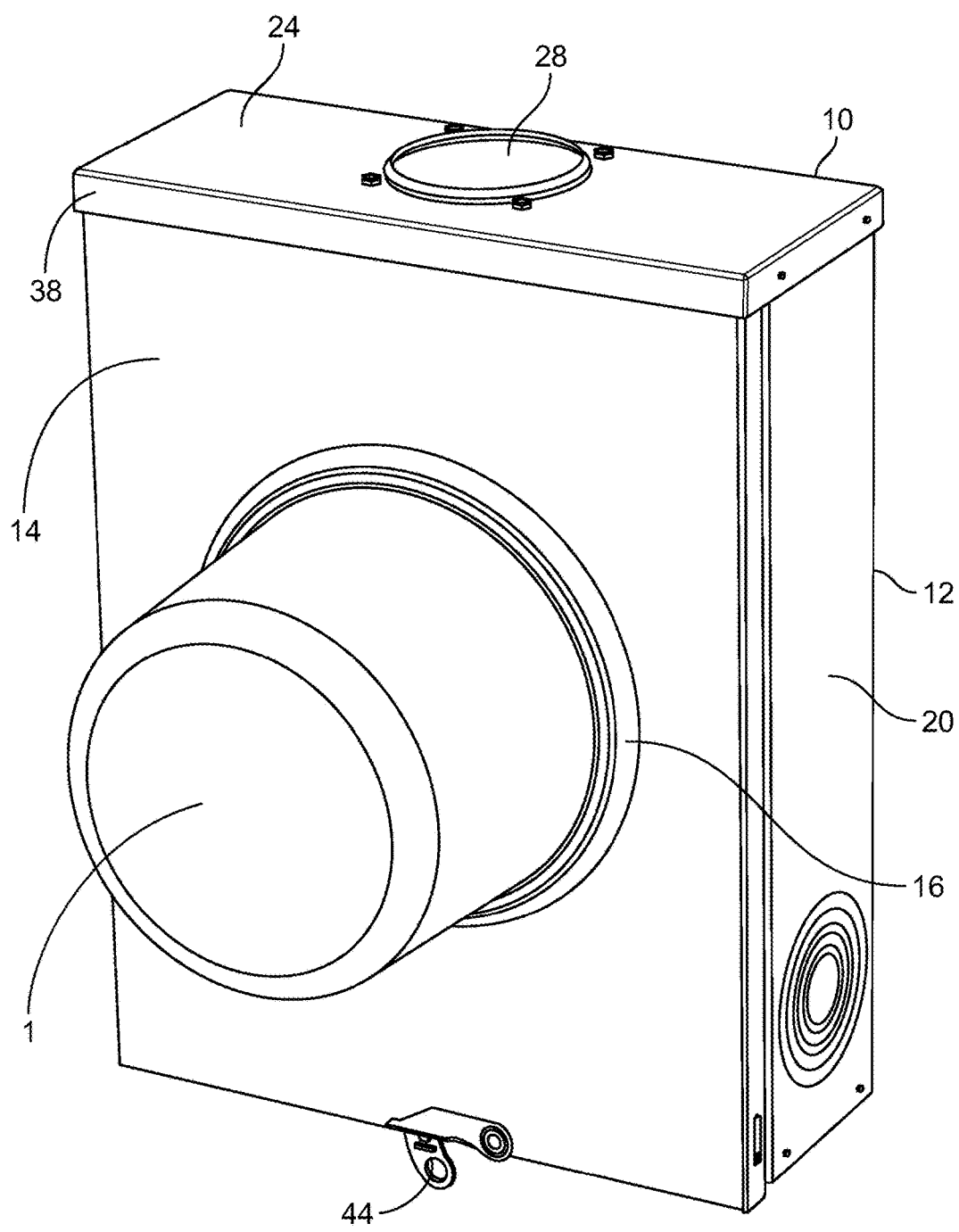
FIG. 1A is a perspective view of an electric watt-hour meter installed within a ringless meter socket of a single-phase power system in accordance with a first exemplary embodiment of the present invention.

The present invention is directed to a meter socket with a tamper detection assembly that includes a light sensor and/or an acoustic sensor to detect tampering with the meter socket. The present invention is also directed to a meter socket with an electronic device, such as the tamper detection assembly, mounted within the mounting block of the meter socket so as to provide a secure source of power and communications for the electronic device. While the present invention will be described in detail below with reference to various exemplary embodiments, it should be understood that the invention is not limited to the specific configurations or methodologies of these embodiments. In addition, although the exemplary embodiments are described as embodying several different inventive features, one skilled in the art will appreciate that any one of these features could be implemented without the others in accordance with the present invention.

1. First Exemplary Embodiment

FIGS. 1A-1B and 2-4 show a single-phase power system comprising an electric watt-hour meter 1 installed within a meter socket 10 in accordance with a first exemplary embodiment of the present invention. Meter socket 10 is known as a "ringless" meter socket and has a standardized form to allow the interchangeability of meters from various manufacturers without removing any wires or cables. While meter socket 10 may be employed for meters capable of continuous full load currents of 20 to 400 amperes, it is most typically utilized for residential applications of 200 amperes.

In this exemplary embodiment, meter 1 is an AMI meter that communicates with the electric power utility over an existing communication network. The configuration of meter 1 is shown in greater detail in FIG. 21. As can be seen, meter 1 includes a cylindrical cover 2 that is made of glass, transparent plastic (e.g., polycarbonate), or any other suitable material. Cover 2 is secured to a meter base 3 so as to enclose various electronic components within the meter. These electronic components are well known to those skilled in the art and, as will be described below, are modified to enable meter 1 to receive, log and/or report tamper data in accordance with the present invention. Preferably, a seal (not shown) is used to provide a tight connection between cover 2 and meter base 3 and thereby protect the electronic components from environmental elements. An annular flange 8 extends radially outward from base 3 and includes a front rim 8a that provides a mounting connection to a meter socket.

Meter 1 also includes two upper connector blades 4 (only one of which can be seen in FIG. 21) and two lower connector blades 5 (only one of which can be seen in FIG. 21) that extend outward from the back side of meter base 3. As described below, connector blades 4 and 5 are positioned to snap into the upper and lower meter jaws, respectively, of meter jaw block assemblies (such as of the meter jaw block assemblies 60 and 62 shown in FIG. 3, described below). A blade 6 also extends outward from the back side of meter base 3 and, as described below, is positioned to engage an electrical connector 76 used as a neutral reference (shown in FIG. 3). Four legs 7 are also provided that protect blades 4, 5 and 6 when meter 1 is not installed.

Figure 1B:
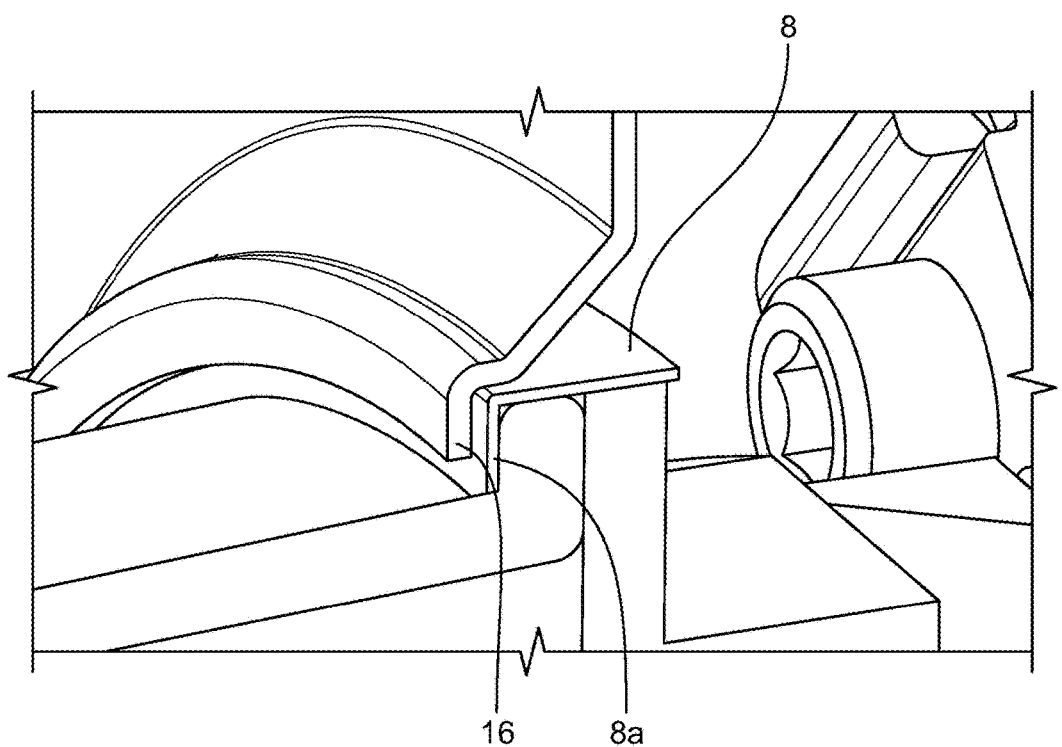
FIG. 1B is an enlarged cross-sectional view of the ringless meter socket and installed meter shown in FIG. 1A showing the cover of the meter socket enclosure retaining the meter in the meter socket.

Referring to FIG. 1A, meter socket 10 includes an enclosure 12 having a front wall or cover 14 with a raised embossment 16 surrounding a circular opening through which meter 1 extends. As shown in FIG. 1B, raised embossment 16 engages front rim 8a of annular flange 8 on meter 1 (also shown in FIG. 21) when cover 14 is latched to thereby retain meter 1 against the meter supports 78 and 80 (shown in FIG. 3) of meter socket 10, as described below. Thus, it can be appreciated that meter 1 can only be removed from meter socket 10 if cover 14 is removed from meter socket enclosure 12.

Figure 2:
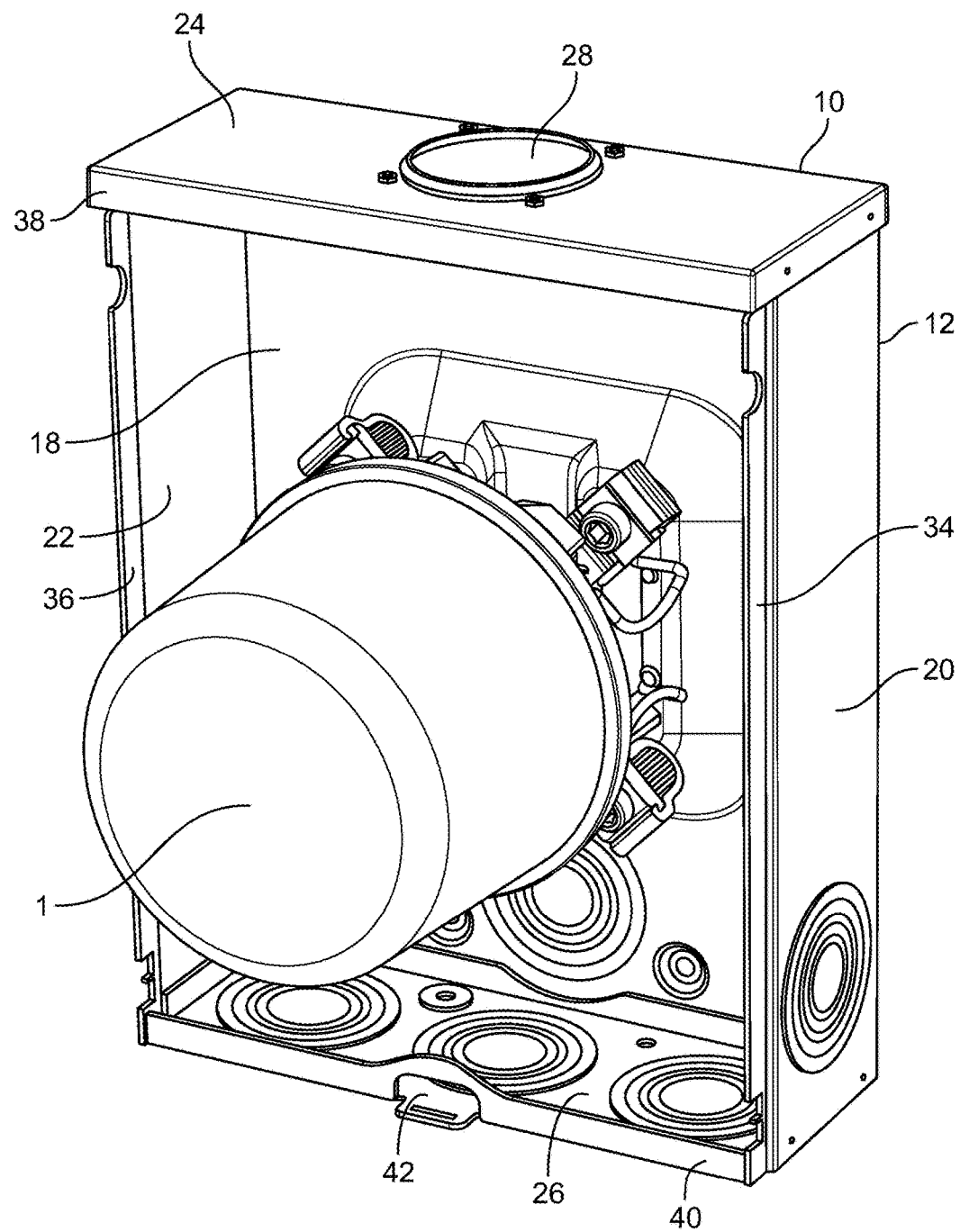
FIG. 2 is a perspective view of the meter socket and installed meter shown in FIG. 1A with the cover of the meter socket enclosure removed from the meter socket.
Figure 3:
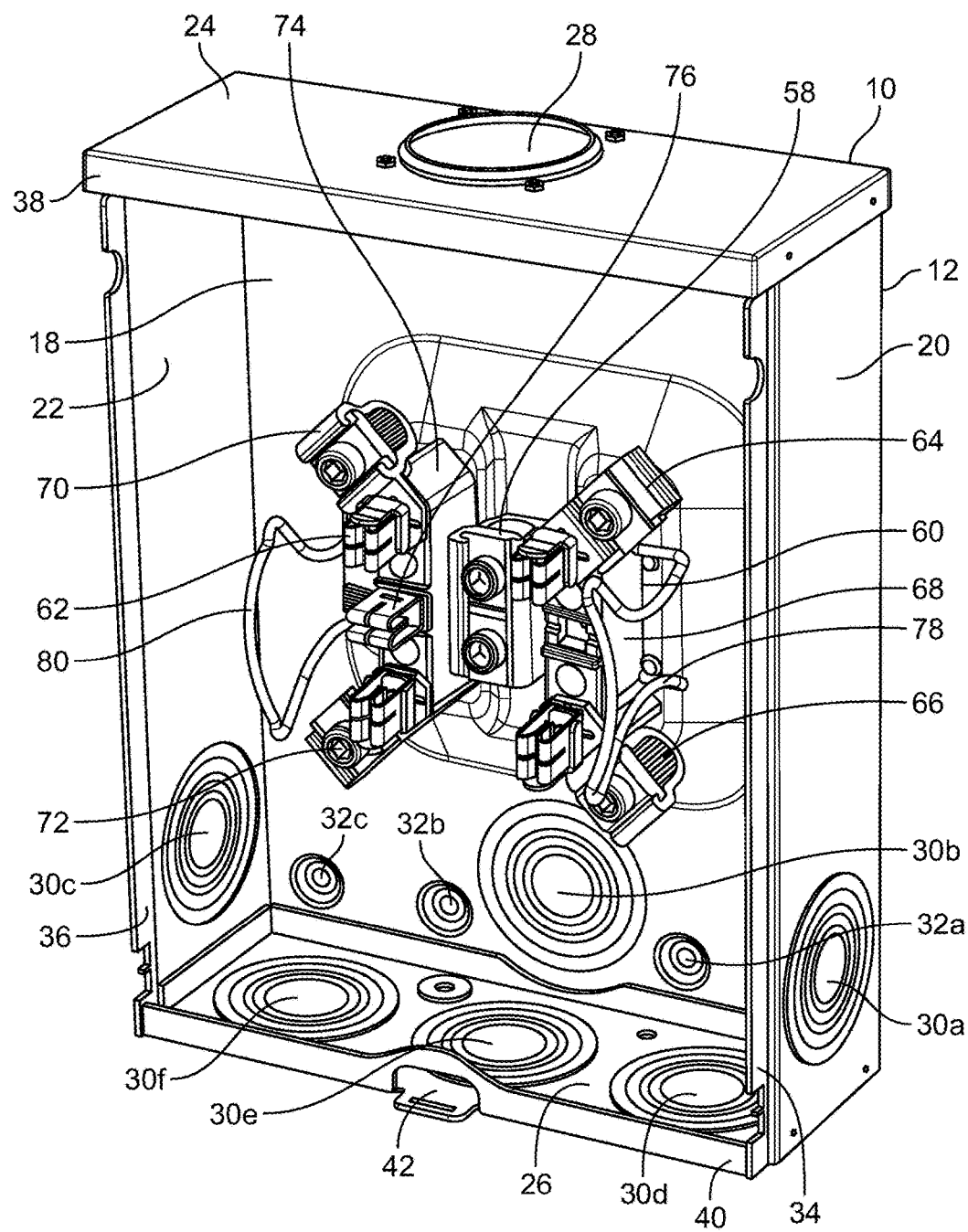
FIG. 3 is a perspective view of the meter socket shown in FIG. 2 with the meter removed from the meter socket.
Figure 4:
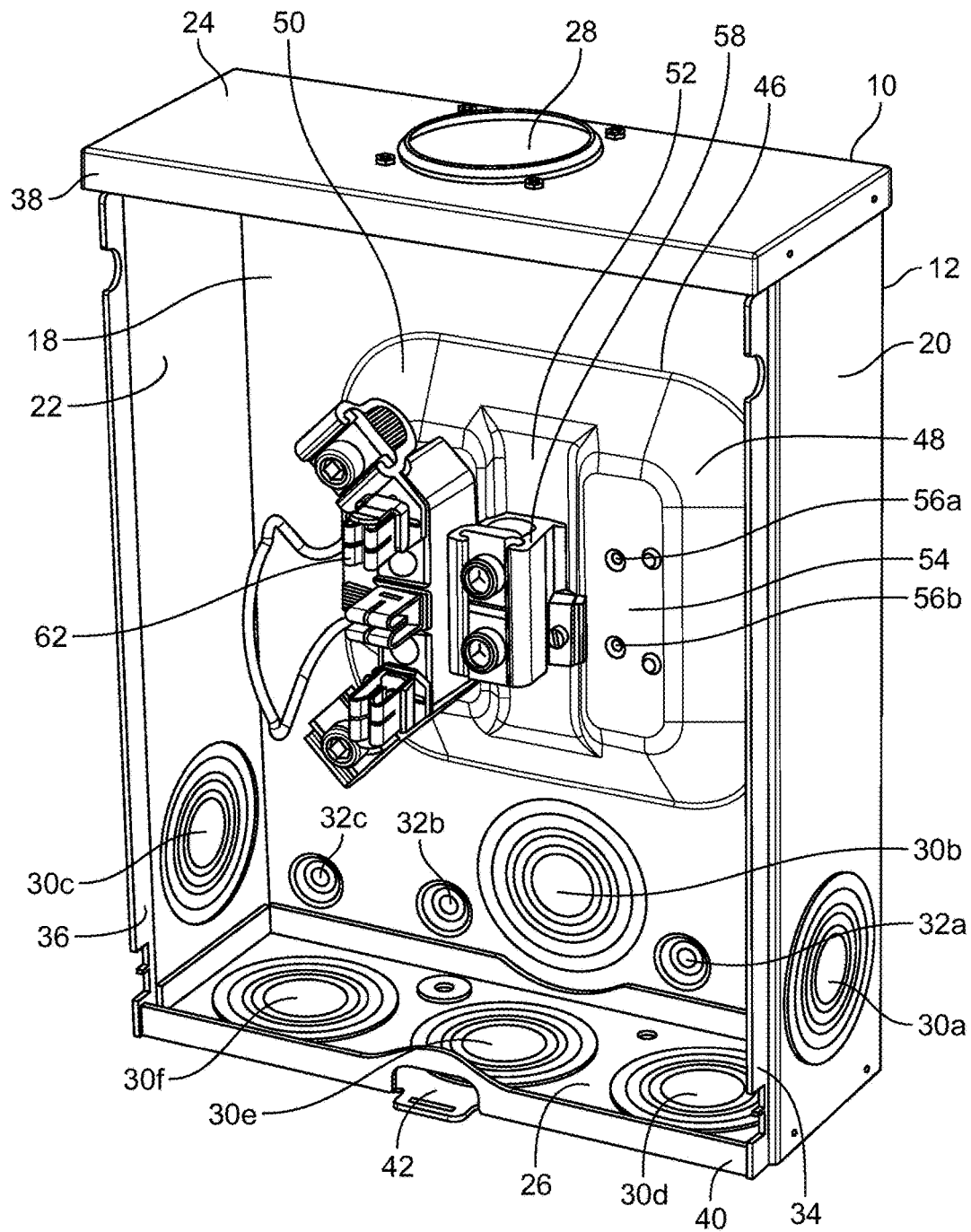
FIG. 4 is a perspective view of the meter socket shown in FIG. 3 with the right meter jaw block assembly removed from the meter socket.

As shown in FIGS. 2-4, meter socket enclosure 12 also includes a back wall 18, a pair of laterally spaced side walls 20 and 22, a top wall 24, and a bottom wall 26. Side walls 20 and 22 are integral with back wall 18 and are formed by bending side portions of an enclosure blank. Top and bottom walls 24 and 26 are formed as separate members and are secured to back wall 18 and side walls 20 and 22 by any suitable attachment means, such as by spot welding, fasteners, or the like. Of course, top and bottom walls 24 and 26 could alternatively be formed integral with back wall 18.

Top wall 24 is provided with an opening 28 to receive the power supply conductors (not shown) from the electric power utility. As best shown in FIGS. 3 and 4, bottom wall 26 and lower portions of side walls 20 and 22 and back wall 18 are provided with knock-outs 30a-30f, which may be selectively opened to enable the power load conductors (not shown) to exit enclosure 12 for routing to a customer premises. Back wall 18 is provided with preformed holes 32a-32c that receive fasteners to secure enclosure 12 to a supporting wall.

To accommodate cover 14, side walls 20 and 22 include in set edges 34 and 36, respectively, while top and bottom walls 24 and 26 include top and bottom flanges 38 and 40, respectively. The upper edge of cover 14 fits under top flange 38 and the inturned side edges of cover 14 overlap in set edges 34 and 36. Bottom flange 40 underlies the bottom edge of cover 14. Bottom flange 40 is provided with a slotted tab 42 that engages a latch 44 rotationally fixed by a rivet to cover 14 (shown in FIG. 1A). Electric power utility personnel use a custom tool to secure latch 44 on tab 42 and prevent unauthorized removal of cover 14 (and thus meter 1) from meter socket 10.

As best shown in FIG. 4, meter socket enclosure 12 includes a riser structure 46 that is formed by embossing or stamping back wall 18 between a set of appropriately shaped dies during manufacture of enclosure 12. Riser structure 46 has a pair of laterally spaced risers 48 and 50 separated by a recessed wall 52. Each of risers 48 and 50 includes a planar front wall 54 (only the front wall of riser 48 can be seen in FIG. 4) spaced forward of back wall 18. The spacing of each front wall 54 from back wall 18 is chosen to properly position two meter jaw block assemblies 60 and 62 (shown in FIG. 3) in relation to back wall 18. Each front wall 54 is also provided with holes 56a and 56b (only the holes of front wall 54 can be seen in FIG. 4) to receive respective mounting screws to thereby secure meter jaw block assemblies 60 and 62 to front walls 54 of risers 48 and 50. Recessed wall 52 forms a separation between riser walls 48 and 50 and includes holes (not shown) to receive a ground conductor connector 58. Recessed wall 52 is positioned in a recessed plane located between the plane of back wall 18 and the plane of front walls 54 of risers 48 and 50.

One skilled in the art will appreciate that other types of riser structures may also be used in accordance with the present invention. For example, a riser structure could be configured with a single riser (instead of risers 48 and 50 and recessed wall 52) of sufficient width for proper spacing of meter jaw block assemblies 60 and 62. Also, a separate riser structure could be provided that is secured to back wall 18. Further, a riser structure could be used that mounts three or more meter jaw block assemblies, such as for use with a three-phase system (as described below in connection with the third exemplary embodiment of FIGS. 22 and 23).

Referring to FIG. 3, meter socket 10 includes a first meter jaw block assembly 60 secured to the front wall of riser 48 and a second meter jaw block assembly 62 secured to the front wall of riser 50. Meter jaw block assembly 60 includes a top electrical connector 64 and a bottom electrical connector 66 each of which is mounted to an insulating mounting block 68. Similarly, meter jaw block assembly 62 includes a top electrical connector 70 and a bottom electrical connector 72 each of which is mounted to an insulating mounting block 74. It can be appreciated that electric utility power is provided at top electrical connectors 64 and 68 and customer power is provided at bottom electrical connectors 66 and 70. Mounting blocks 68 and 74 function to insulate top electrical connectors 64 and 70 and bottom electrical connectors 66 and 72 from enclosure 12. Optionally, a fifth electrical connector 76 may be mounted within an opening in the center of mounting block 74 and used as a neutral reference for certain types of service. Notably, mounting block 68 has an opening in its center (similar to the opening in mounting block 74 that mounts fifth electrical connector 76) that is utilized to provide line-of-sight access to a light sensor of a tamper detection assembly, as described below. Meter jaw block assemblies 60 and 62 also include meter supports 78 and 80 that provide a mounting surface and transient suppression ground terminal for meter 1.

Referring to FIGS. 5-9, the configuration of meter jaw block assembly 60 (with meter support 78 removed) will now be described in greater detail. One skilled in the art will appreciate that meter jaw block assembly 62 is structurally the same as meter jaw block assembly 60 and will not be separately described herein.

As just described, meter jaw block assembly 60 includes an insulating mounting block 68 with top electrical connector 64 and bottom electrical connector 66 secured thereto. As best shown in FIG. 8, top electrical connector 64 includes a U-shaped connector 82 that is electrically and thermally coupled to a meter jaw 84 by a bolt 86 and jaw nut 88. A slide nut 90 engages a pair of receiving grooves in connector 82 and a slide screw 92 acts to force stranded wire placed in connector 82 into good mechanical, electrical and thermal contact with connector 82. Meter jaw 84 is configured to receive the right connector blade 4 of meter 1 (shown in FIG. 21). As can be seen, bolt 86 extends through a hole in mounting block 68 (from the back side to the front side) and through holes in connector 82 and meter jaw 84 before it is pushed into jaw nut 88 to thereby secure top electrical connector 64 to mounting block 68. When assembled, a head 94 of bolt 86 is located within mounting block 68 as shown in FIG. 7 and, as described below, is positioned to provide a connection to a spring contact 132 on a printed circuit board 122 (shown in FIG. 10) so as to provide secure power to the tamper detection assembly of the first exemplary embodiment.

Similarly, bottom electrical connector 66 includes a U-shaped connector 96 that is electrically and thermally coupled to a meter jaw 98 by a bolt 100 and jaw nut 102. A slide nut 104 engages a pair of receiving grooves in connector 96 and a slide screw (not shown in FIG. 8) acts to force stranded wire placed in connector 96 into good mechanical, electrical and thermal contact with connector 96. Meter jaw 98 is configured to receive the right connector blade 5 of meter 1 (shown in FIG. 21). As can be seen, bolt 100 extends through a hole in mounting block 68 (from the back side to the front side) and through holes in connector 96 and meter jaw 98 before it is pushed into jaw nut 102 to thereby secure bottom electrical connector 66 to mounting block 68. When assembled, a head 106 of bolt 100 is located within mounting block 68 as shown in FIG. 7.

Figure 5:
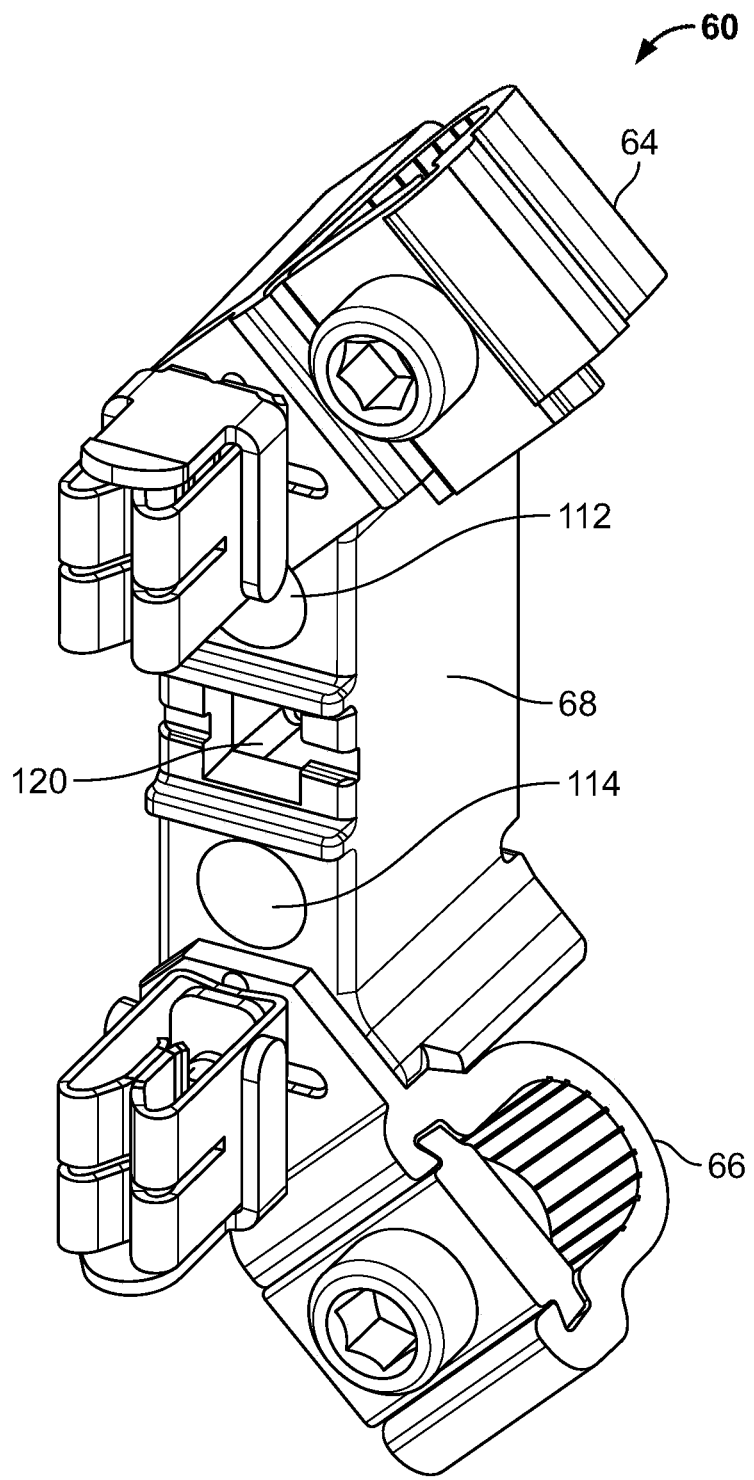
FIG. 5 is a perspective view of the right meter jaw block assembly of the meter socket shown in FIG. 3 with the meter support removed from the assembly.
Figure 6:
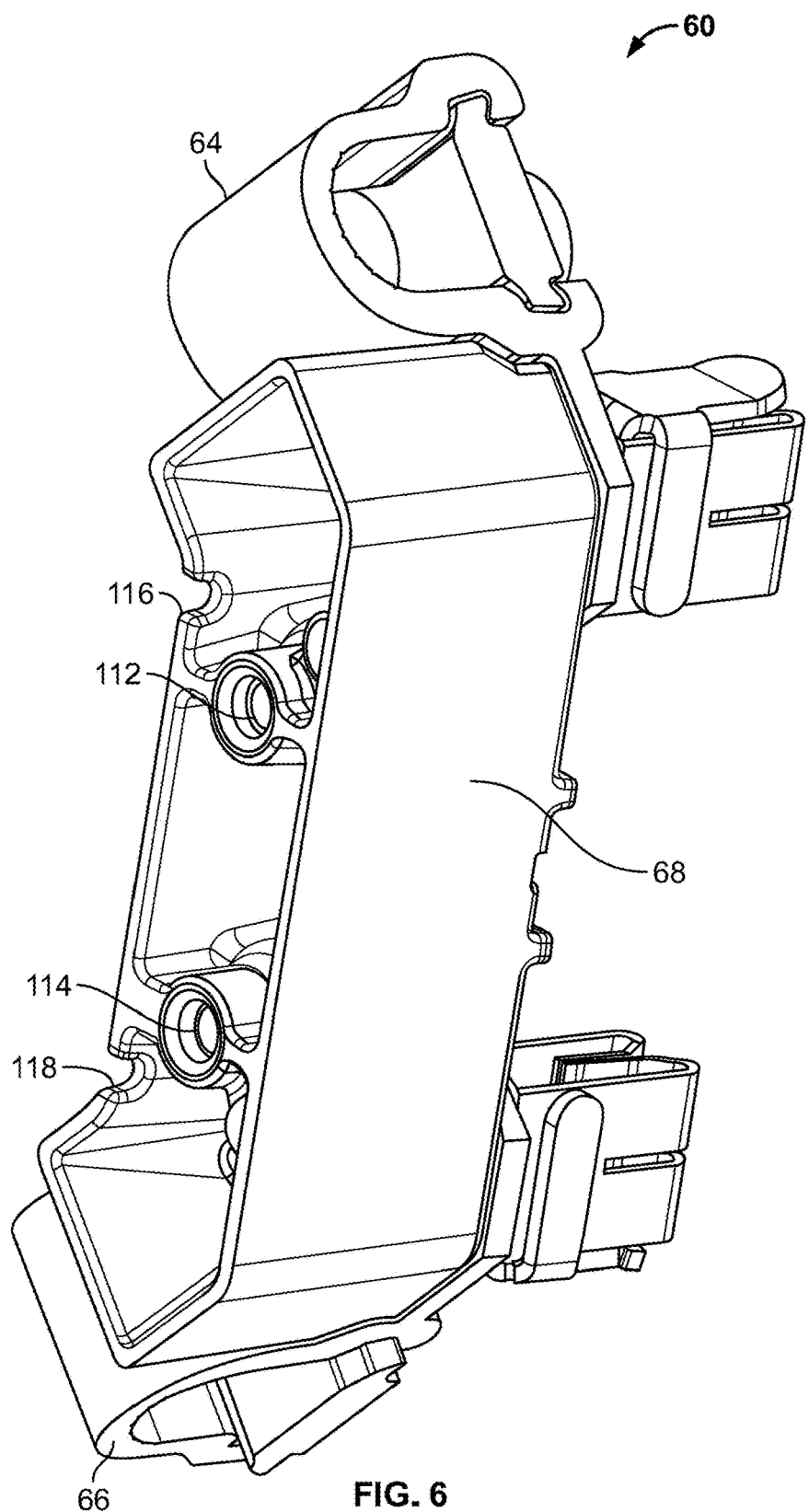
FIG. 6 is a perspective view of the left side of the meter jaw block assembly shown in FIG. 5.
Figure 7:
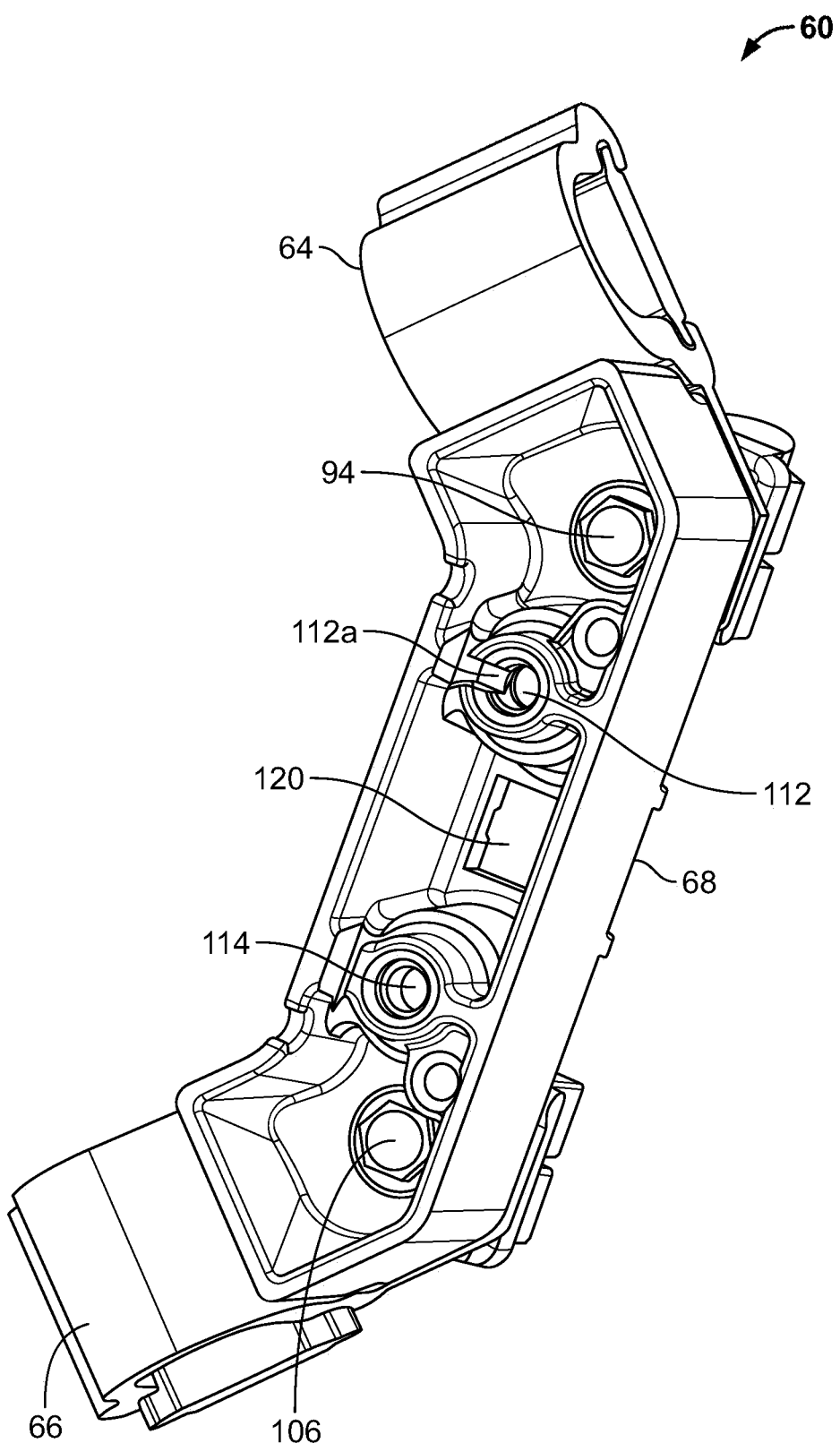
FIG. 7 is a perspective view of the back side of the meter jaw block assembly shown in FIG. 5.
Figure 8:
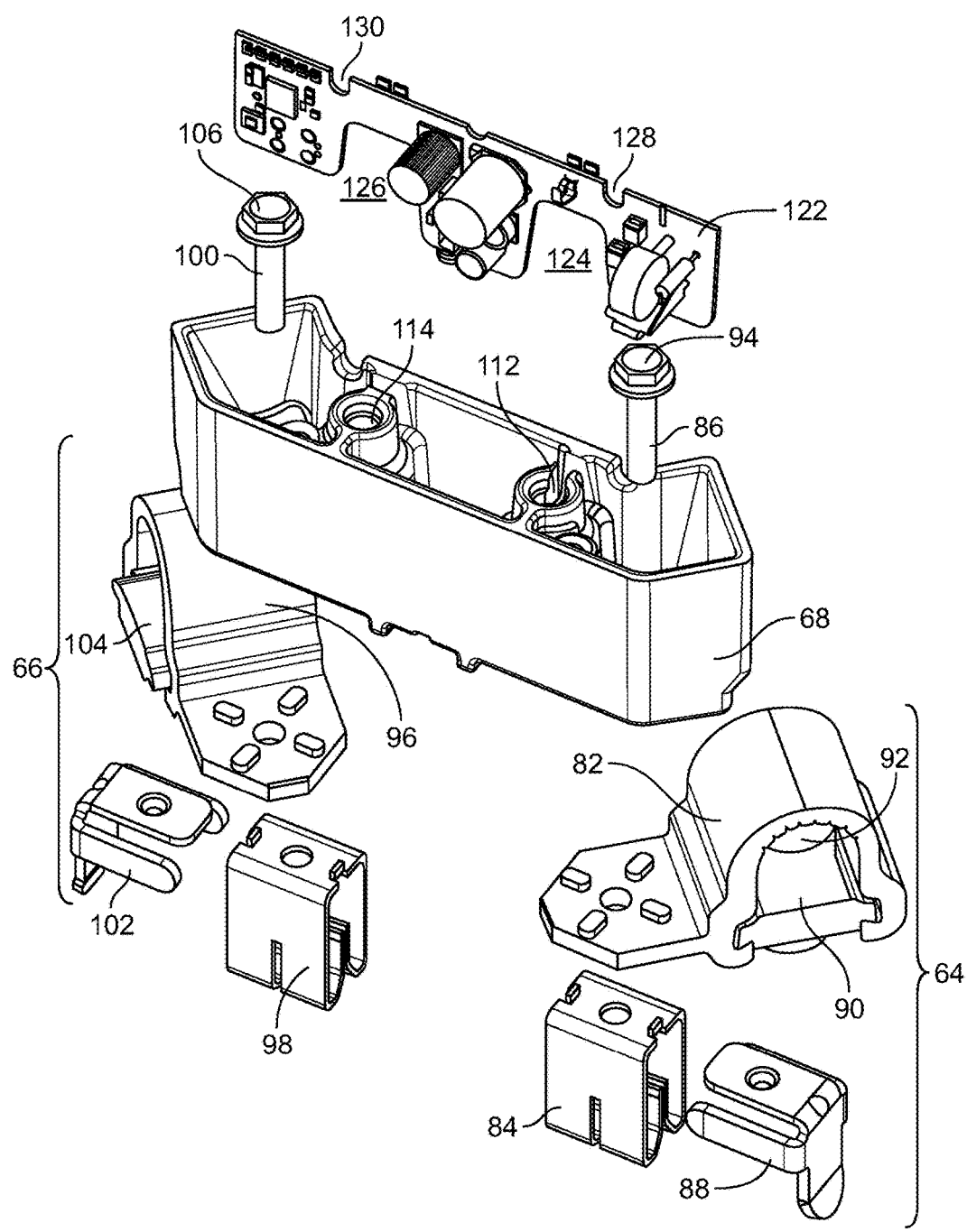
FIG. 8 is an exploded perspective view of the components of the meter jaw block assembly shown in FIG. 6 with a printed circuit board positioned for insertion into the mounting block of the assembly.

Referring to FIG. 5, meter jaw block assembly 60 also includes mounting screws (not shown) that extend through mounting holes 112 and 114 formed in mounting block 68 (also shown in FIGS. 6 and 7). After passing through mounting block 68, the mounting screws are received within holes 56a and 56b provided in front wall 54 of riser 48 (shown in FIG. 4) to secure meter jaw block assembly 60 to enclosure 12. As can be seen in FIG. 7, mounting hole 112 includes a slot 112a formed therein on the back side of mounting block 68. When assembled, the mounting screw that extends through mounting hole 112 is positioned to provide a connection to a spring contact 134 on printed circuit board 122 (shown in FIG. 10), i.e., spring contact 134 extends through slot 112a of mounting hole 112 and contacts the mounting screw so as to provide a connection to electrical ground for the tamper detection assembly of the first exemplary embodiment.

As shown in FIG. 6, mounting block 68 includes two slots 116 and 118 located on its right/back side that are positioned to retain meter support 78 in the appropriate position for mounting meter 1, as shown in FIG. 3. Mounting block 68 also includes an opening 120 that extends through its center, as best shown in FIGS. 5 and 7, which is utilized to provide line-of-sight access to a phototransistor 136 on printed circuit board 122 (shown in FIG. 10) that is used to form a light sensor of a light detection assembly, as described below.

Figure 9:
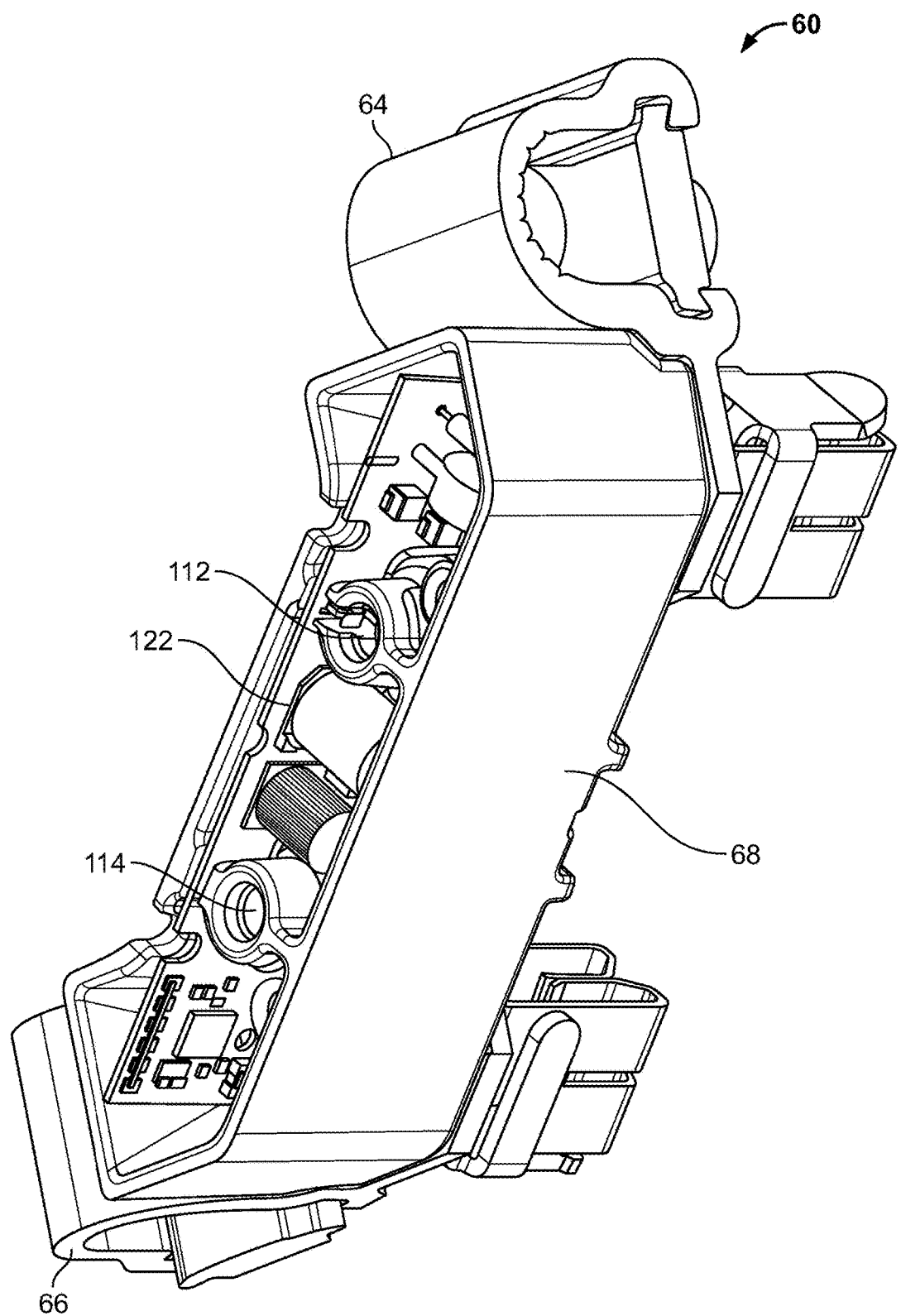
FIG. 9 is a perspective view of the meter jaw block assembly shown in FIG. 6 with the printed circuit board inserted into the mounting block of the assembly.

Referring to FIGS. 8 and 9, meter socket 10 includes a printed circuit board 122 that functions as the tamper detection assembly in the first exemplary embodiment. Printed circuit board 122 may be mounted within mounting block 68 by inserting printed circuit board 122 through the back side of mounting block 68 so that printed circuit board 122 is positioned along the inner surface of the right sidewall of mounting block 68. As can be seen, printed circuit board 122 includes cutouts 124 and 126 that enable printed circuit board 122 to be mounted over the structure of mounting block 68 adjacent mounting holes 112 and 114 (best shown in FIG. 7). Printed circuit board 122 also includes two slots 128 and 130 that align with slots 116 and 118 in mounting block 68, as shown in FIG. 9, to retain meter support 78 in the appropriate position for mounting meter 1.

Figure 10:
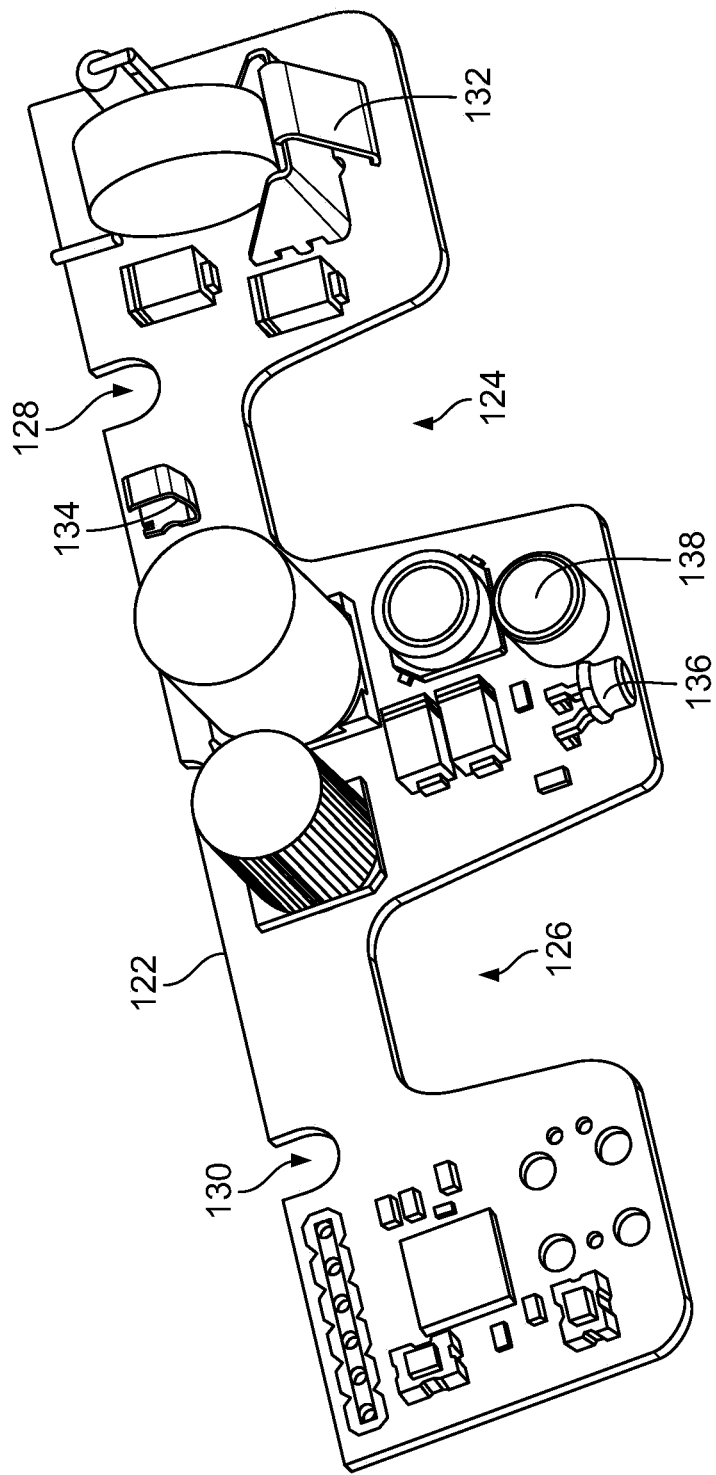
FIG. 10 is a perspective view of the printed circuit board shown in FIGS. 8 and 9.

The components mounted on the surface of printed circuit board 122 facing away from the right sidewall of mounting block 68 can be better seen in FIG. 10. As discussed above, spring contact 132 is mounted on printed circuit board 122 in a position to contact head 94 of bolt 86 of top electrical connector 64 when printed circuit board 122 is inserted into mounting block 68. Because spring contact 132 contacts head 94 of bolt 86, the electric utility power provided at top electrical connector 64 is provided to printed circuit board 122 at spring contact 132. Also, spring contact 134 is mounted on printed circuit board 122 in a position to extend through slot 112a of mounting hole 112 and contact the mounting screw that extends through mounting hole 112 when printed circuit board 122 is inserted into mounting block 68. Because the mounting screw that extends through mounting hole 112 is connected to meter socket enclosure 12, which is grounded, spring contact 134 provides a reference to electrical ground for printed circuit board 122.

Figure 11:
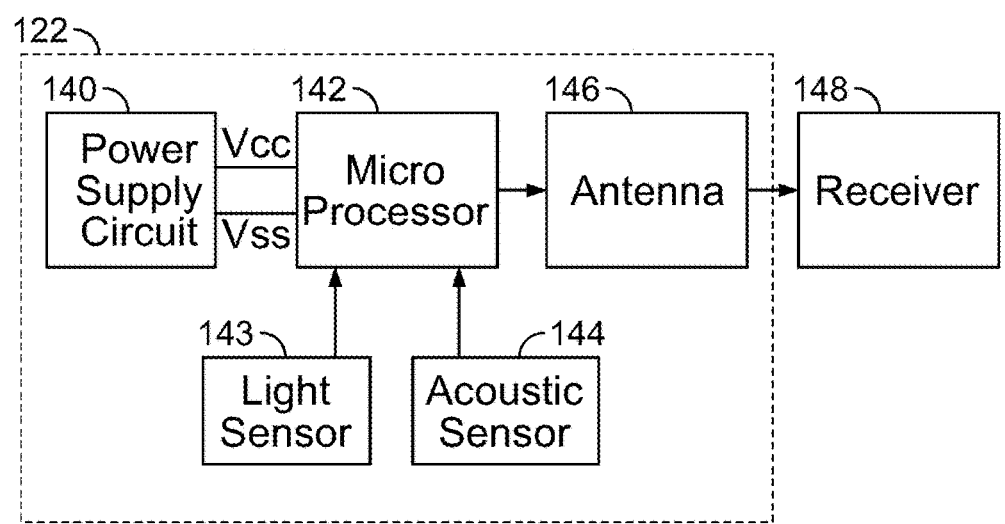
FIG. 11 is a block diagram showing the configuration of the printed circuit board shown in FIG. 10.

Printed circuit board 122 also includes a phototransistor 136 that in combination with other circuit components form a light sensor 143 (shown in FIG. 11). Phototransistor 136 is mounted on printed circuit board 122 in a position directly behind opening 120 in mounting block 68 when printed circuit board 122 is inserted into mounting block 68 so as to detect ambient light within meter socket 10. As described below, light sensor 143 provides a signal to a microprocessor 142 (shown in FIG. 11) on printed circuit board 122, wherein the voltage value of the signal provides an indication of the light level of the detected ambient light. Microprocessor 142 compares this voltage value to a preset light tamper detection value in order to detect tampering caused by an energy thief removing cover 14 of meter socket enclosure 12 (as shown in FIG. 2) and potentially further removing meter 1 from meter socket 10 (as shown in FIG. 3). Either of these types of tampering would enable the energy thief to access the top U-shaped connectors (such as connector 82) and steal electricity before it is metered.

Printed circuit board 122 also includes an electrostatic microphone 138 that in combination with other circuit components form an acoustic sensor 144 (shown in FIG. 11). Acoustic sensor 144 has a very fast rise time and a relatively slow fall time to create an "envelope" waveform. As described below, acoustic sensor 144 provides the waveform to microprocessor 142 (shown in FIG. 11) on printed circuit board 122, wherein the voltage value of the waveform provides an indication of the sound level within meter socket 10. Microprocessor 142 compares this voltage value to a preset sound tamper detection value in order to detect tampering caused by an energy thief drilling, cutting, hammering, bending or otherwise attempting to violate the integrity of meter socket enclosure 12 in an effort to access the top U-shaped connectors (such as connector 82) and steal electricity before it is metered.

A block diagram showing the configuration of printed circuit board 122 is provided in FIG. 11. As can be seen, printed circuit board 122 includes a power supply circuit 140 that obtains electric utility power from top electrical connector 64 through spring clip 132. Power supply circuit 140 is also connected to electrical ground through spring contact 134. Power supply circuit 140 includes circuit components that provide a positive voltage supply (VCC) and an electrical ground reference (VSS) for microprocessor 142.

Microprocessor 142 is configured to receive a signal from light sensor 143, as described above. Microprocessor 142 is programmed to compare the voltage value of this signal to a preset light tamper detection value. If the voltage value exceeds the preset light tamper detection value, microprocessor 142 causes transmission of tamper data to a receiver 148. In the first exemplary embodiment, the preset light tamper detection value is a voltage value corresponding to a light level in the range of about 0.2 lux to about 20 lux. A preferred light tamper detection value is a voltage value corresponding to a light level of about 10 lux. Of course, other light tamper detection values may also be used in accordance with the present invention. It can be appreciated that the voltage value of the signal received from light sensor 143 will exceed the preset light tamper detection value if an energy thief removes cover 14 of meter socket enclosure 12 (as shown in FIG. 2) whereby reflected light passes through opening 120 in mounting block 68 to phototransistor 136 of light sensor 143. The voltage value will be even higher if the energy thief further removes meter 1 from meter socket 10

(as shown in FIG. 3) because the light can directly pass through opening 120 in mounting block 68 to phototransistor 136 of light sensor 143.

Microprocessor 142 is also configured to receive a waveform from acoustic sensor 144, as described above. Microprocessor 142 is programmed to compare the voltage value of this waveform to a preset sound tamper detection value. If the voltage value exceeds the preset sound tamper detection value for longer than a preset time period value, microprocessor 142 causes transmission of tamper data to receiver 148. In the first exemplary embodiment, the sound tamper detection value is a voltage value corresponding to a sound level in the range of about 0.2 Pa to about 2.0 Pa (i.e., about 80 $db_{spl}$ to about 100 $db_{spl}$) and the preset time period value is in the range of about 0.5 seconds to about 5.0 seconds. Of course, other sound tamper detection values and/or time period values may also be used in accordance with the present invention. It can be appreciated that the voltage value of the waveform received from acoustic sensor 144 will exceed the preset sound tamper detection value for longer than the preset time period value if an energy thief drills, cuts, hammers, bends or otherwise attempts to violate the integrity of meter socket enclosure 12. In each of these instances, meter socket enclosure 12 acts as a sounding board or resonator to provide an amplifying effect on the sound level and thereby increases the voltage value of the waveform.

Of course, one skilled in the art will understand that printed circuit board 122 could include just one of light sensor 143 or acoustic sensor 144 without departing from the scope of the present invention. Also, other types of light sensors could be used, including photoemission or photoelectric devices such as photomultiplier tubes, microchannel plate detectors, photo-transistors, CMOS image sensors, cadmium zinc telluride photo-resistors, reverse biased light emitting diodes (LEDs) which act as photodiodes, or photovoltaic cells. In addition, other types of acoustic sensors could be used, including microphones, micro-electro mechanical systems (MEMS), accelerometers, or piezoelectric sensors.

Printed circuit board 122 includes circuit components that are tuned to form antenna 146. Microprocessor 142 is connected to antenna 146 so as to enable communication with a paired receiver 148 using Near Field Communication (NFC), Bluetooth Low Energy, Advanced and Adaptive Network Technology (ANT), or other low power wireless point-to-point technology. In the first exemplary embodiment, receiver 148 is located inside meter 1 and is integrated with the meter's communication bus. When microprocessor 142 transmits tamper data to receiver 148, receiver 148 logs the tamper data and/or relays the tamper data to the electric power utility over the existing communication network. The tamper data may comprise a single bit to indicate a tamper event, or may comprise additional information such as the light level or sound level of the tamper event. Further, it is possible to provide two-way communication between printed circuit board 122 and receiver 148 to enable receiver to transmit data to printed circuit board 122. For example, receiver 148 may transmit data to printed circuit board 122 in order to adjust the light and/or sound tamper detection values used by microprocessor 142 or otherwise provide new programming to microprocessor 142.

The operation of printed circuit board 122 will now be described with reference to the flow charts of FIGS. 12 and 13A-13B.

Figure 12:
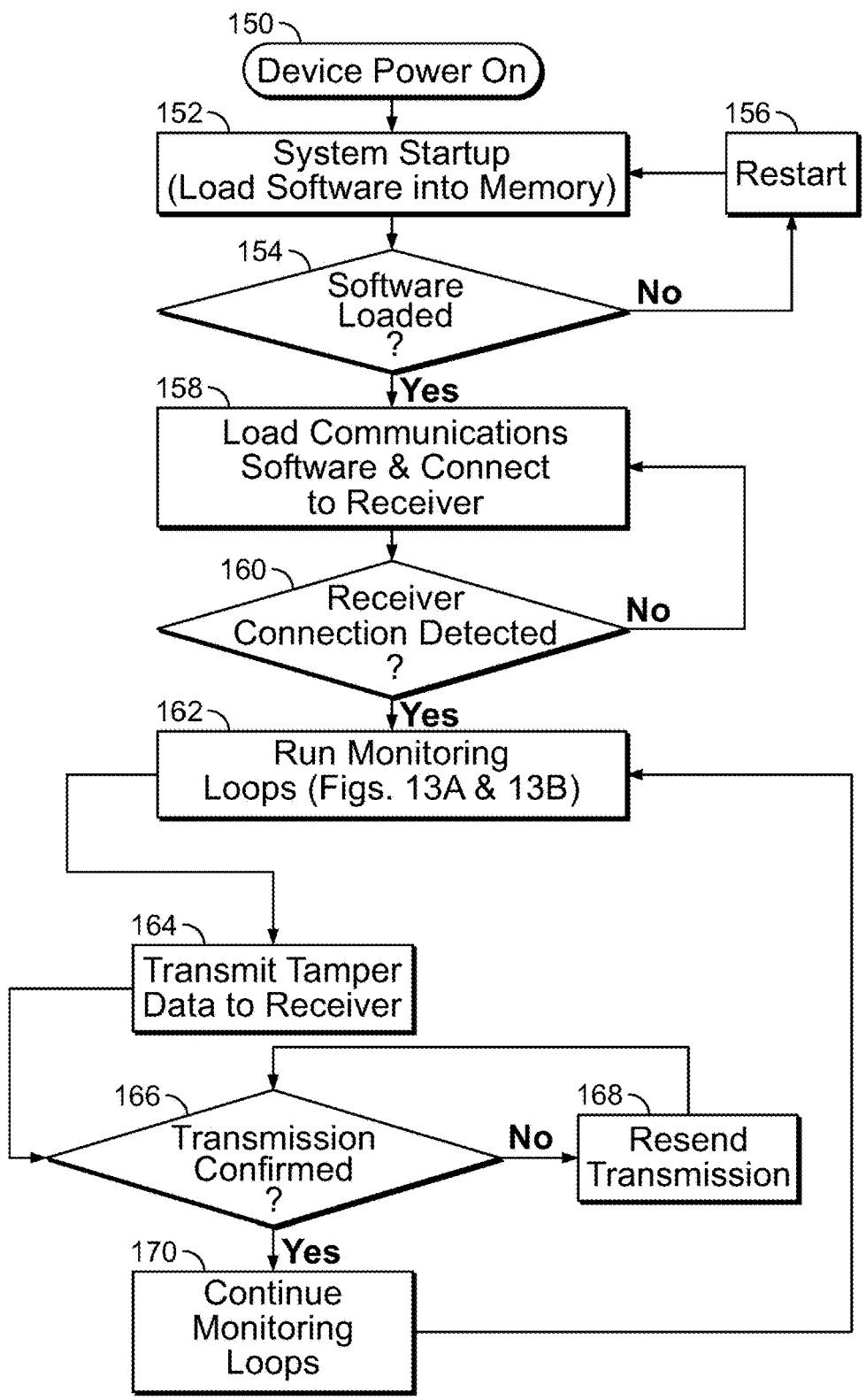
FIG. 12 is a flow chart showing the method steps performed by the printed circuit board shown in FIG. 11.

As shown in the flow chart of FIG. 12, at step 150, power is provided to microprocessor 142 via power supply circuit 140. At step 152, operating software is loaded into the memory of microprocessor 142 during system startup. At step 154, a check is performed to determine if the operating software was successfully loaded. If not, microprocessor 142 is restarted at step 156 and the operating software is loaded again into the memory of microprocessor 142 at step 152. If the operating software is successfully loaded, then, at step 158, communications software is loaded into the memory of microprocessor 142 whereby microprocessor 142 attempts to establish a connection with receiver 148. At step 160, a check is performed to determine if microprocessor 142 successfully established a connection with receiver 148. If not, the communications software is loaded again into the memory of microprocessor 142 and another connection attempt is made at step 158. If microprocessor 142 successfully established a connection with receiver 148, then microprocessor 142 runs light detection and sound detection monitoring loops at step 162. These monitoring loops are described below in connection with the flow charts of FIGS. 13A-13B.

If either of the monitoring loops detects a tamper event, then, at step 164, microprocessor 142 transmits tamper data to receiver 148. At step 166, a check is performed to determine if microprocessor 142 successfully transmitted the tamper data to receiver 148. If not, microprocessor 142 re-transmits the tamper data to receiver 148. If microprocessor 142 successfully transmitted the tamper data to receiver 148, then microprocessor 142 continues to run the light detection and sound detection monitoring loops at step 162.

Figure 13A:
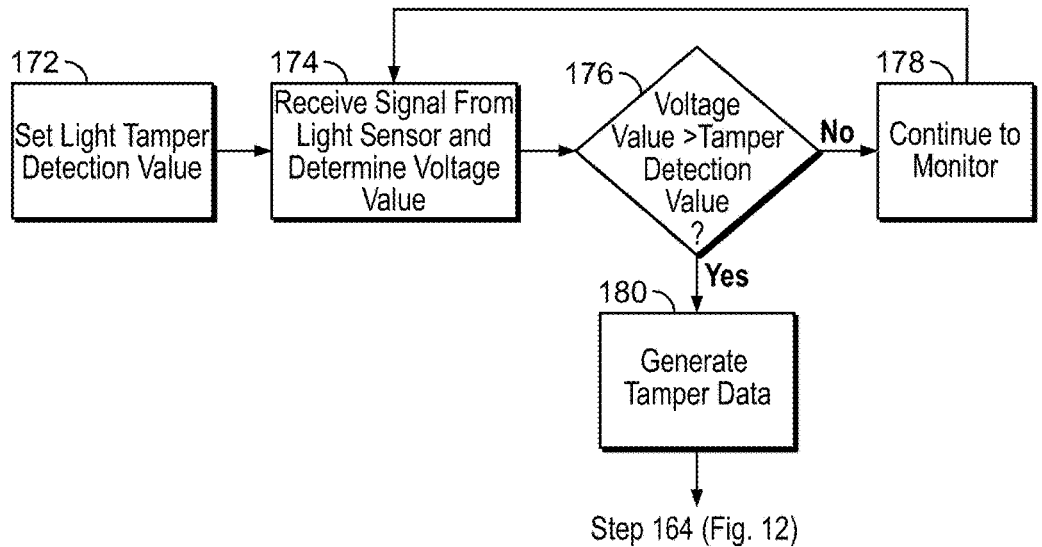
FIG. 13A is a flow chart showing the light monitoring loop referenced in the flow chart shown in FIG. 12.

The flow chart of FIG. 13A shows the steps of the light detection monitoring loop provided at step 162 of FIG. 12. At step 172, microprocessor 142 sets the light tamper detection value. As discussed above, in the first exemplary embodiment, the preset light tamper detection value is a voltage value corresponding to a light level in the range of about 0.2 lux to about 20 lux. It should be understood that this voltage value will vary depending on the circuit components used in light sensor 143. At step 174, microprocessor 142 receives a signal from light sensor 143 and determines the voltage value of this signal. One skilled in the art will appreciate that the voltage value will increase with an increase in the light level of the detected ambient light. At step 176, microprocessor 142 compares the voltage value of the received signal to the preset light tamper detection value. If the voltage value of the received signal is less than the preset light tamper detection value, then microprocessor 142 continues the monitoring loop at step 178 and the process returns to step 174. However, if the voltage value of the received signal is greater than the preset light tamper detection value, then microprocessor 142 generates tamper data at step 180 and the process proceeds to step 164 of FIG. 12.

Of course, it should be understood that the present invention is not limited to the voltage level detection method shown in FIG. 13A and that other methods of detecting a tamper event may also be used within the scope of the present invention.

For example, in one embodiment, a tamper event is detected if the voltage value of the received signal is greater than the preset light tamper detection value for a period of time that is longer than a preset time period value. This method adds a delay time to the voltage level detection method described above.

In another embodiment, a method is used in which microprocessor 142 determines the average voltage value of the signal received from light sensor 143 over a short period of time (i.e., a short time average voltage) and the average voltage value of the signal received from light sensor 143 over a long period of time (i.e., a long time average voltage). For example, the short period of time may be in the range of about 1 second to about 30 seconds and the long period of time may be in the range of about 1 minute to about 1 hour. When employing digital rolling average filters, the short and long periods of time may be defined by the number of samples (which are determined by the sampling frequency or the clock frequency). For example, the short period of time may be the time required to obtain about 1,000 samples to about 30,000 samples and the long period of time may be the time required to obtain about 60,000 samples to about 3,600,000 samples. Microprocessor 142 then compares the short time average voltage to the long time average voltage, and generates tamper data when the short time average voltage exceeds the long time average voltage. In yet another embodiment, microprocessor 142 generates tamper data when the short time average voltage exceeds the long time average voltage for a period of time that is greater than a preset time period value.

In a further embodiment, a method is used in which microprocessor 142 utilizes a hole-filler. Specifically, once the voltage value of the signal received from light sensor 143 exceeds the light tamper detection value, a hole-filler may be used that allows the voltage value to fall below the light tamper detection value for a preset time period and still be considered a tamper event. For example, the preset time period value may be about 0.1 seconds to about 2.0 seconds. It should be understood that the hole-filler method may applied to any of the tamper detection methods described above, including the method described in connection with FIG. 13A or the methods of the alternative embodiments.

It should be understood that any of the preset values described above (e.g., light tamper detection value and various preset time period values) may be selected and programmed into microprocessor 142 at the time of manufacture of the tamper detection assembly. Alternatively, these preset values may be selected and programmed into microprocessor 142 by a worker in the field, although this may not be preferred insofar as the electric power utility would not be able to maintain control over the settings used in the tamper detection assembly.

Figure 13B:
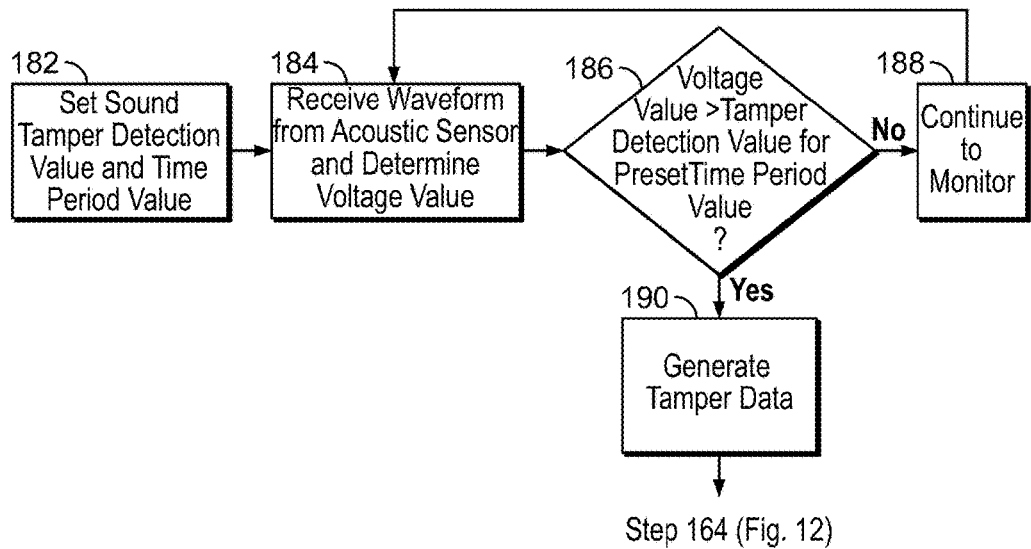
FIG. 13B is a flow chart showing the sound monitoring loop referenced in the flow chart shown in FIG. 12.

The flow chart of FIG. 13B shows the steps of the sound detection monitoring loop provided at step 162 of FIG. 12. At step 182, microprocessor 142 sets the sound tamper detection value and the associated time period value. As discussed above, in the first exemplary embodiment, the preset sound tamper detection value is a voltage value corresponding to a sound level in the range of about 0.2 Pa to about 2.0 Pa. It should be understood that this voltage value will vary depending on the circuit components used in acoustic sensor 144. As also discussed above, the preset time period value is in the range of about 0.5 seconds to about 5.0 seconds. At step 184, microprocessor 142 receives an "envelope" waveform from acoustic sensor 144 and determines the voltage value of this waveform. One skilled in the art will appreciate that the voltage value will increase with an increase in the sound level within meter socket 10. At step 186, microprocessor 142 compares the voltage value of the received waveform to the preset sound tamper detection value. If the voltage value of the received waveform is less than the preset sound tamper detection value, then microprocessor 142 continues the monitoring loop at step 188 and the process returns to step 184. However, if the voltage value of the received waveform is greater than the preset sound tamper detection value for a time period that is longer than the preset time period value, then microprocessor 142 generates tamper data at step 190 and the process proceeds to step 164 in FIG. 12.

Of course, it should be understood that the present invention is not limited to the voltage level detection with delay time method shown in FIG. 13B and that other methods of detecting a tamper event may also be used within the scope of the present invention.

For example, in one embodiment, a tamper event is detected if the voltage value of the received waveform is greater than the preset sound tamper detection value. This method eliminates the delay time of the method described above.

In another embodiment, a method is used in which microprocessor 142 determines the average voltage value of the waveform received from acoustic sensor 144 over a short period of time (i.e., a short time average voltage) and the average voltage value of the waveform received from acoustic sensor 144 over a long period of time (i.e., a long time average voltage). For example, the short period of time may be in the range of about 1 second to about 30 seconds and the long period of time may be in the range of about 1 minute to about 1 hour. When employing digital rolling average filters, the short and long periods of time may be defined by the number of samples (which are determined by the sampling frequency or the clock frequency). For example, the short period of time may be the time required to obtain about 1,000 samples to about 30,000 samples and the long period of time may be the time required to obtain about 60,000 samples to about 3,600,000 samples. Microprocessor 142 then compares the short time average voltage to the long time average voltage, and generates tamper data when the short time average voltage exceeds the long time average voltage. In yet another embodiment, microprocessor 142 generates tamper data when the short time average voltage exceeds the long time average voltage for a period of time that is greater than a preset time period value.

In a further embodiment, a method is used in which microprocessor 142 utilizes a hole-filler. Specifically, once the voltage value of the waveform received from acoustic sensor 144 exceeds the sound tamper detection value, a hole-filler may be used that allows the voltage value to fall below the sound tamper detection value for a preset time period and still be considered a tamper event. For example, the preset time period value may be about 0.1 seconds to about 2.0 seconds. Thus, in the event that an energy thief attempts to access the power supply connectors and steal electricity by drilling through the meter socket enclosure, this method may be used to "fill in the holes" between individual drillings each of which may last for a relatively short period of time (e.g., where the energy thief drills in 1 second bursts). It should be understood that the hole-filler method may applied to any of the tamper detection methods described above, including the method described in connection with FIG. 13B or the methods of the alternative embodiments.

It should be understood that any of the preset values described above (e.g., sound tamper detection value and various preset time period values) may be selected and programmed into microprocessor 142 at the time of manufacture of the tamper detection assembly. Alternatively, these preset values may be selected and programmed into microprocessor 142 by a worker in the field, although this may not be preferred insofar as the electric power utility would not be able to maintain control over the settings used in the tamper detection assembly.

Figure 14:
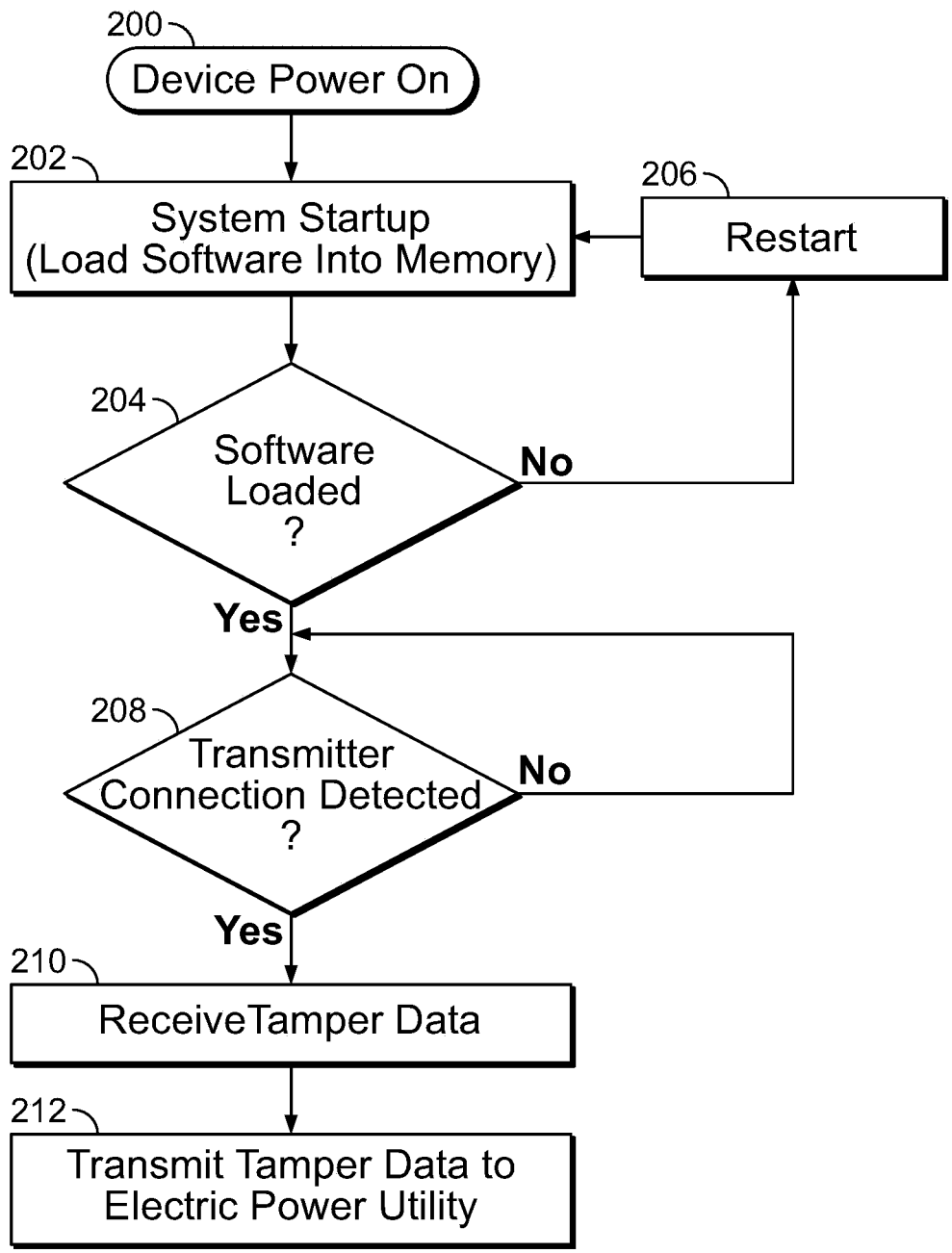
FIG. 14 is a flow chart showing the method steps performed by the receiver shown in FIG. 11.

The operation of receiver 148 will now be described with reference to the flow chart of FIG. 14. At step 200, power is provided to receiver 148 via meter 1. At step 202, operating software is loaded into the memory of receiver 148 during system startup. At step 204, a check is performed to determine if the operating software was successfully loaded. If not, receiver 148 is restarted at step 206 and the operating software is loaded again into the memory of receiver 148 at step 202. If the operating software is successfully loaded, then, at step 208, receiver 148 determines if a connection has been made by printed circuit board 122 (i.e., the transmitter) and listens for tamper data. Step 208 continues until tamper data is received at step 210. Upon the receipt of tamper data, receiver 148 communicates the information to the meter communications bus and the meter logs the tamper data and/or transmits the tamper data to the electric power utility over the existing communication network.

2. Second Exemplary Embodiment

Figure 19:
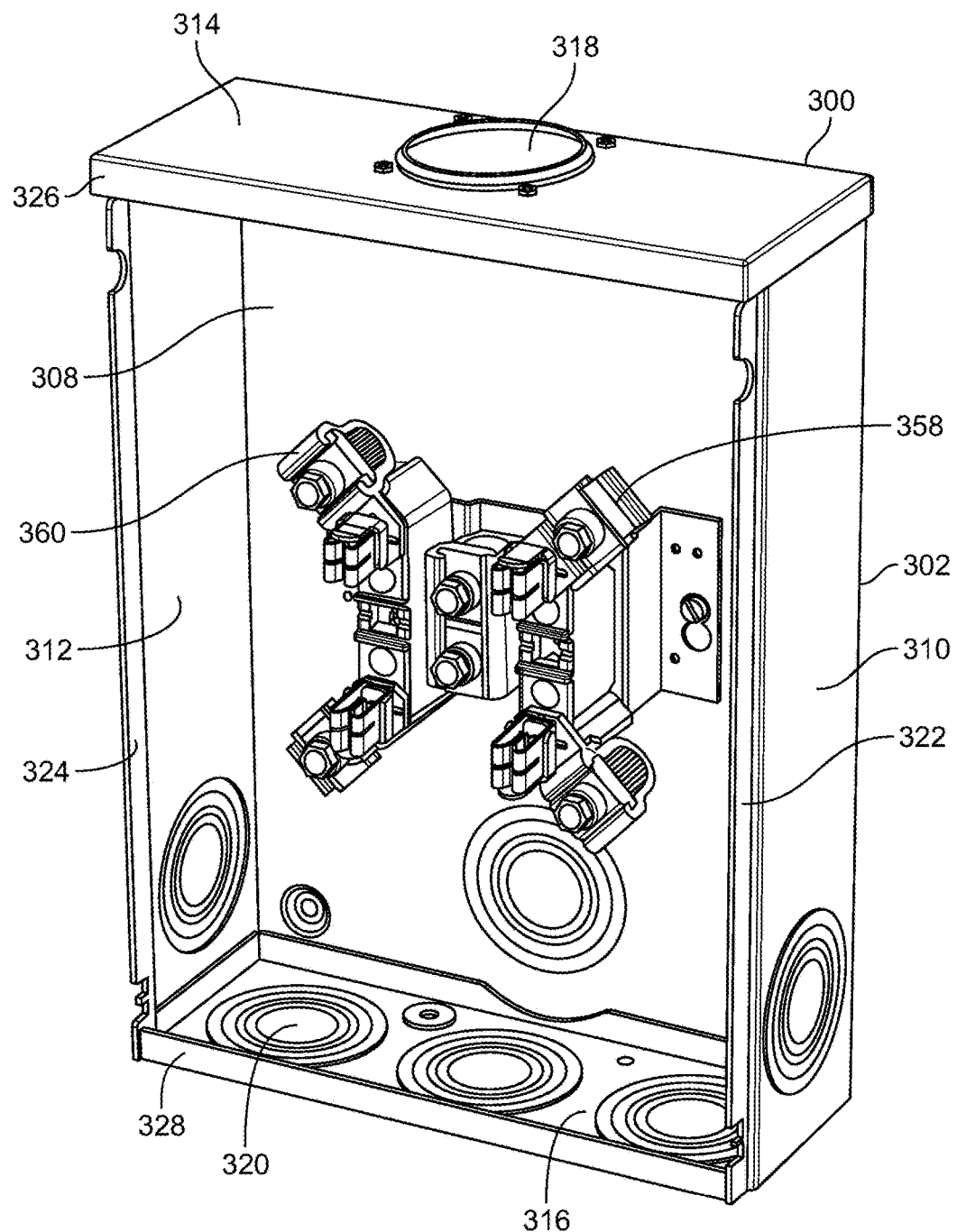
FIG. 19 is a perspective view of the meter socket shown in FIG. 17 with the cover of the meter socket enclosure removed from the meter socket.
Figure 20:
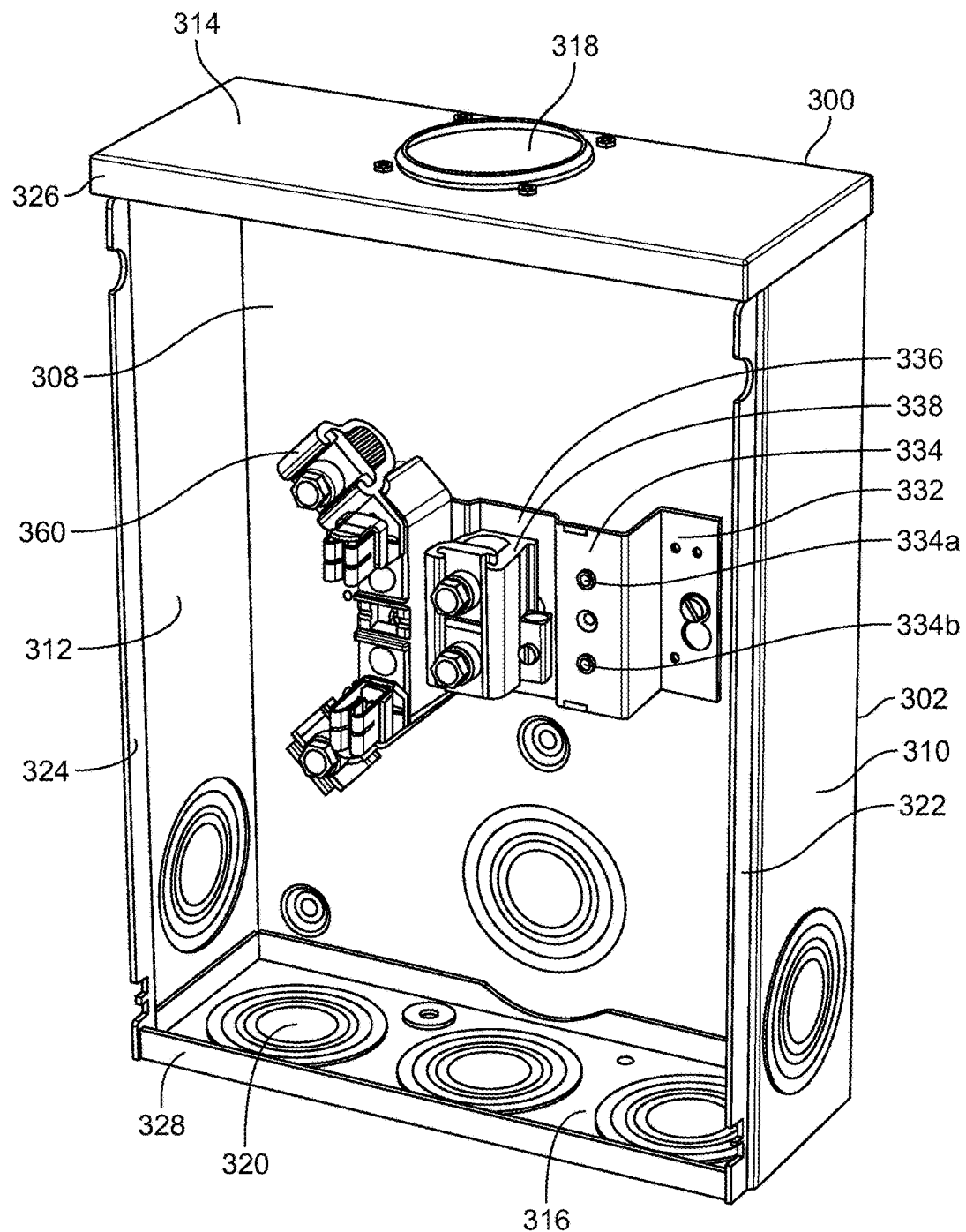
FIG. 20 is a perspective view of the meter socket shown in FIG. 19 with the right meter jaw block assembly removed from the meter socket.
Figure 21:
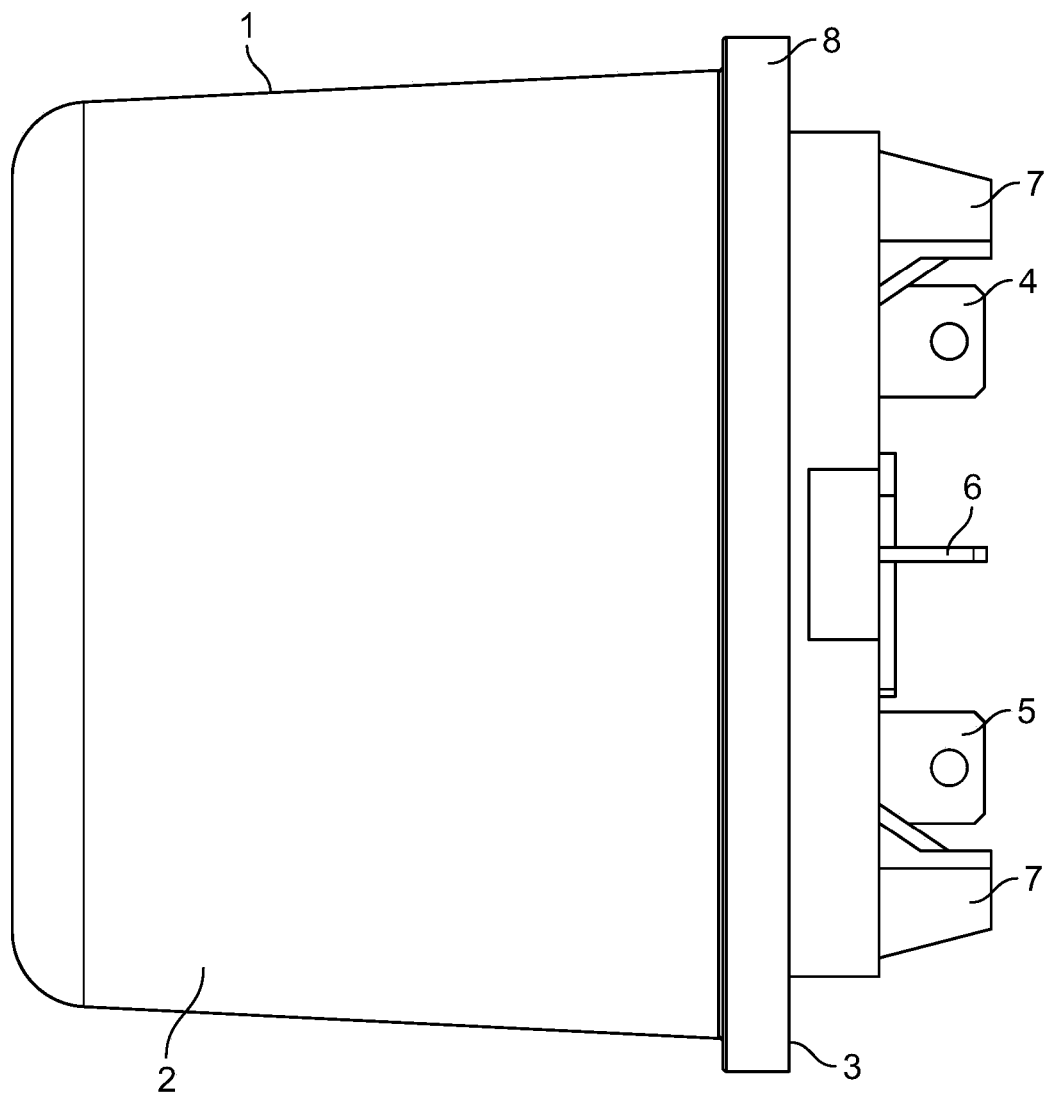
FIG. 21 is a right side elevational view of the electric watt-hour meter shown in FIGS. 1A and 15A.

FIGS. 15A-15B and 16-20 show a single-phase power system comprising an electric watt-hour meter 1 (i.e., the same meter described above in connection with the first exemplary embodiment and shown in FIG. 21) installed within a meter socket 300 in accordance with a second exemplary embodiment of the present invention. Meter socket 300 is known as a "ring-type" meter socket and has a standardized form to allow the interchangeability of meters from various manufacturers without removing any wires or cables. While meter socket 300 may be employed for meters capable of continuous full load currents of 20 to 400 amperes, it is most typically utilized for residential applications of 200 amperes.

Figure 15A:
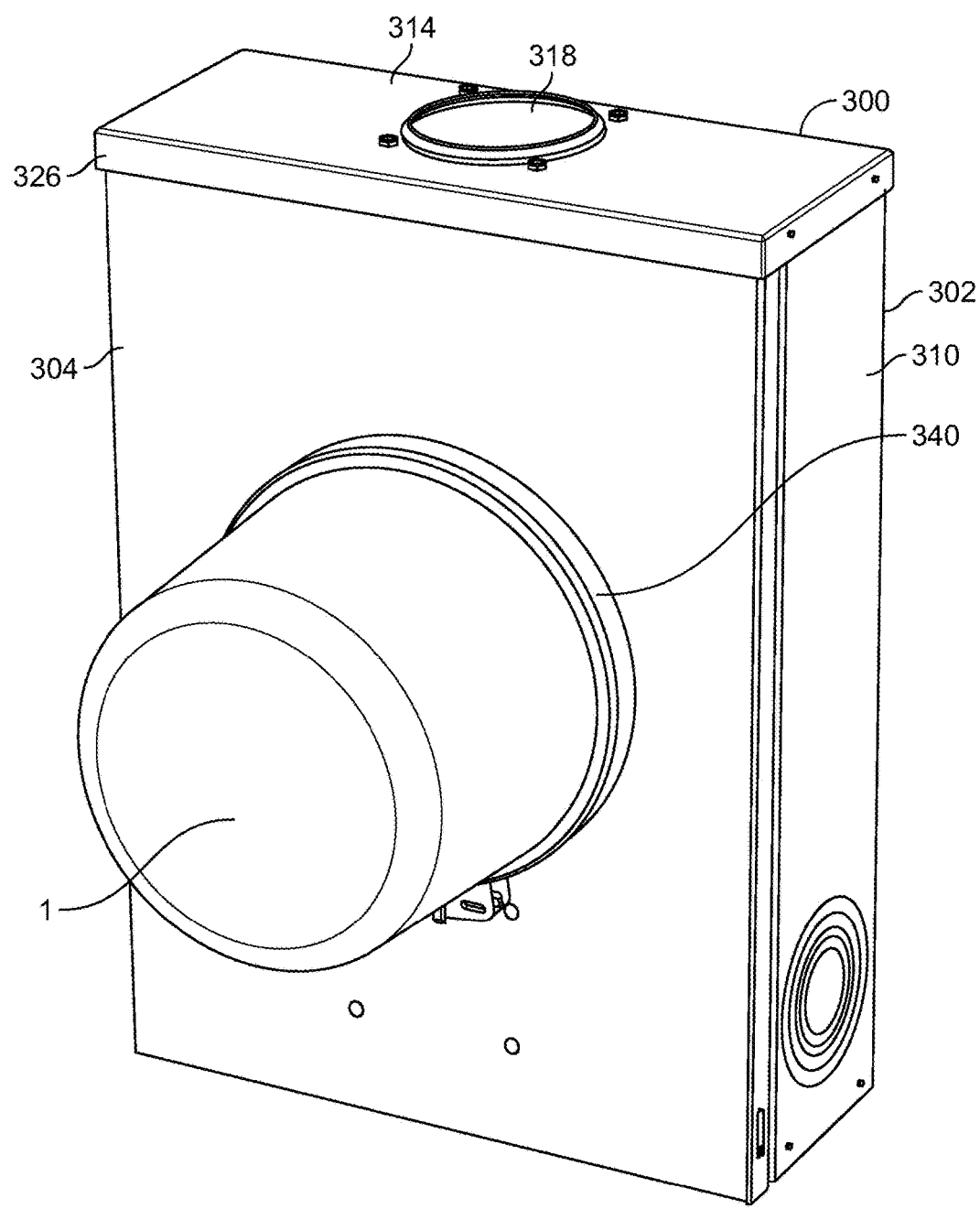
FIG. 15A is a perspective view of an electric watt-hour meter installed within a ring-type meter socket of a single-phase power system in accordance with a second exemplary embodiment of the present invention.
Figure 17:
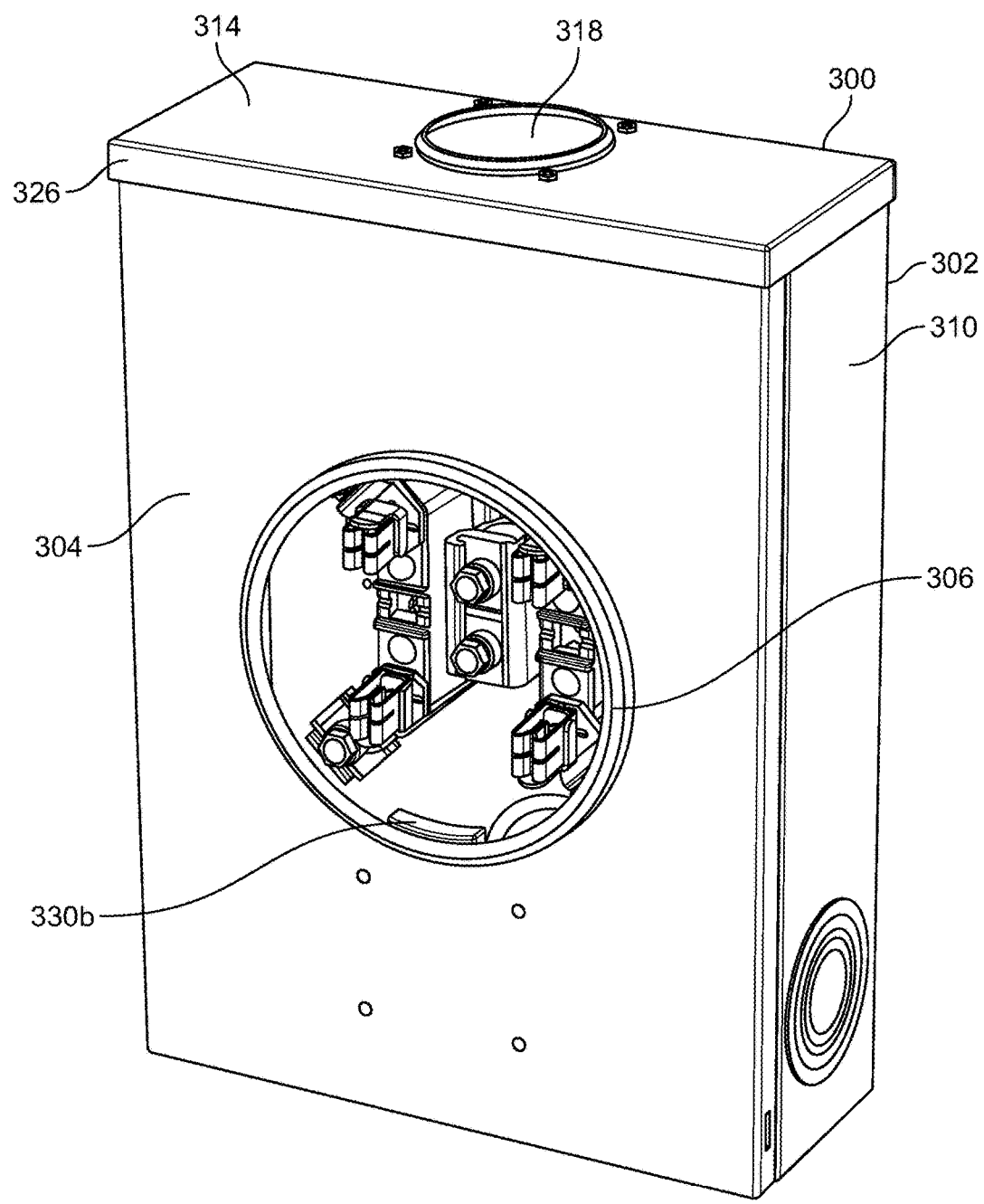
FIG. 17 is a perspective view of the meter socket shown in FIG. 15A with the sealing ring and meter removed from the meter socket.
Figure 18:
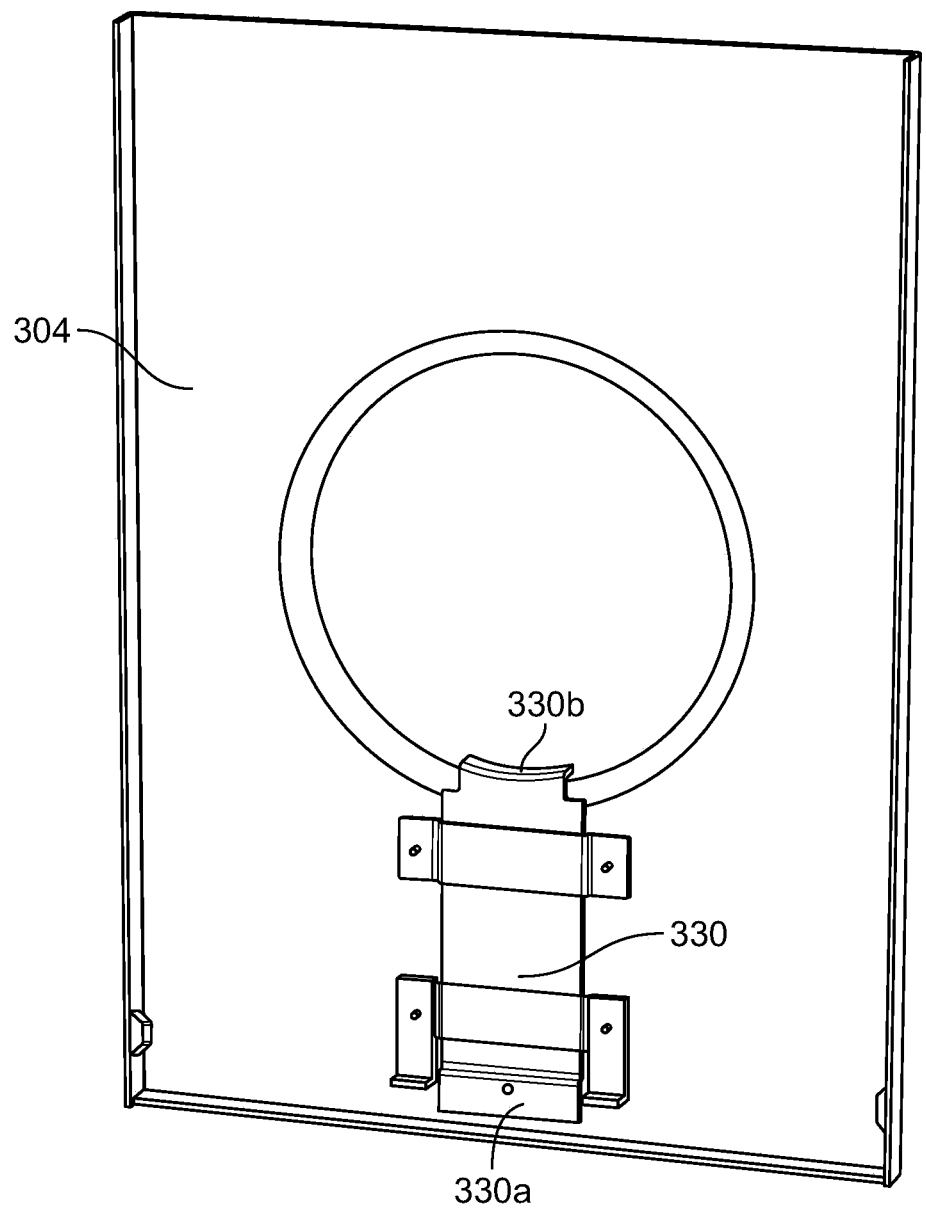
FIG. 18 is a perspective view of the back side of the cover of the meter socket enclosure shown in FIG. 17.

Referring to FIGS. 15A and 17, meter socket 300 includes an enclosure 302 having a front wall or cover 304 with an outwardly rolled curl 306 (best shown in FIG. 15B) surrounding a circular opening through which meter 1 extends. As shown in FIGS. 19 and 20, meter socket enclosure 302 also includes a back wall 308, a pair of laterally spaced side walls 310 and 312, a top wall 314, and a bottom wall 316. Side walls 310 and 312 are integral with back wall 308 and are formed by bending side portions of an enclosure blank. Top and bottom walls 314 and 316 are formed as separate members and are secured to back wall 308 and side walls 310 and 312 by any suitable attachment means, such as by spot welding, fasteners, or the like. Of course, top and bottom walls 314 and 316 could alternatively be formed integral with back wall 308.

Top wall 314 is provided with an optional opening 318 to receive the power supply conductors (not shown) from the electric power utility. Bottom wall 316 and lower portions of side walls 310 and 312 and back wall 308 are provided with knock-outs 320 (only one of which is labeled in FIGS. 19 and 20), which may be selectively opened to enable the power load conductors (not shown) to exit enclosure 302 for routing to a customer premises. Back wall 308 is provided with preformed holes that receive fasteners to secure enclosure 302 to a supporting wall.

To accommodate cover 304, side walls 310 and 312 include in set edges 322 and 324, respectively, while top and bottom walls 314 and 316 include top and bottom flanges 326 and 328, respectively. The upper edge of cover 304 fits under top flange 326 and the inturned side edges of cover 304 overlap in set edges 322 and 324. Bottom flange 328 underlies the bottom edge of cover 304. Cover 304 is secured in place by a sliding latch bolt 330 (best shown in FIG. 18) having a bottom tab 330a that engages behind bottom flange 328 when sliding latch bolt 330 is moved in the downward direction. Sliding latch bolt 330 also has a lift-up tab 330b that may be moved in the upward direction in order to enable the removal of cover 304.

As best shown in FIG. 20, meter socket 300 includes a separate riser structure 332 that is secured to back wall 308. Riser structure 332 has a pair of laterally spaced riser walls (only the right riser wall 334 can be seen in FIG. 20) separated by a recessed wall 336. The spacing of the riser walls from back wall 308 is chosen to properly position two meter jaw block assemblies 358 and 360 (shown in FIG. 19) in relation to back wall 308. Each riser wall is also provided with holes (only the holes 334a and 334b of right riser wall 334 can be seen in FIG. 20) to receive respective mounting screws to thereby secure meter jaw block assemblies 358 and 360 to the riser walls. Recessed wall 336 forms a separation between the riser walls and includes holes (not shown) to receive a ground conductor connector 338. Recessed wall 336 is positioned in a recessed plane located between the plane of back wall 308 and the plane of the riser walls. Of course, one skilled in the art will appreciate that other types of riser structures may also be used in accordance with the present invention, such as the riser structure of the first exemplary embodiment.

Referring again to FIG. 15A, meter socket 300 includes a sealing ring 340 that seals meter 1 to meter socket 300. As shown in FIG. 16, sealing ring 340 comprises a ring-shaped annular band 342 having a side wall 344 and a pair of depending rims 346 and 348 (best shown in FIG. 15B). Annular band 342 terminates in spaced ends 350 and 352 that are extensible and retractable relative to each other as annular band 342 is tightened or allowed to expand. A conventional screw-type lock mechanism 354 is secured to side wall 344 of annular band 342 adjacent to ends 350 and 352 by means of rivets, welds, or any other suitable mechanical fasteners, and a screw 356 enables tightening and expansion of annular band 342. Of course, other types of lock mechanisms may also be used in accordance with the present invention.

Figure 15B:
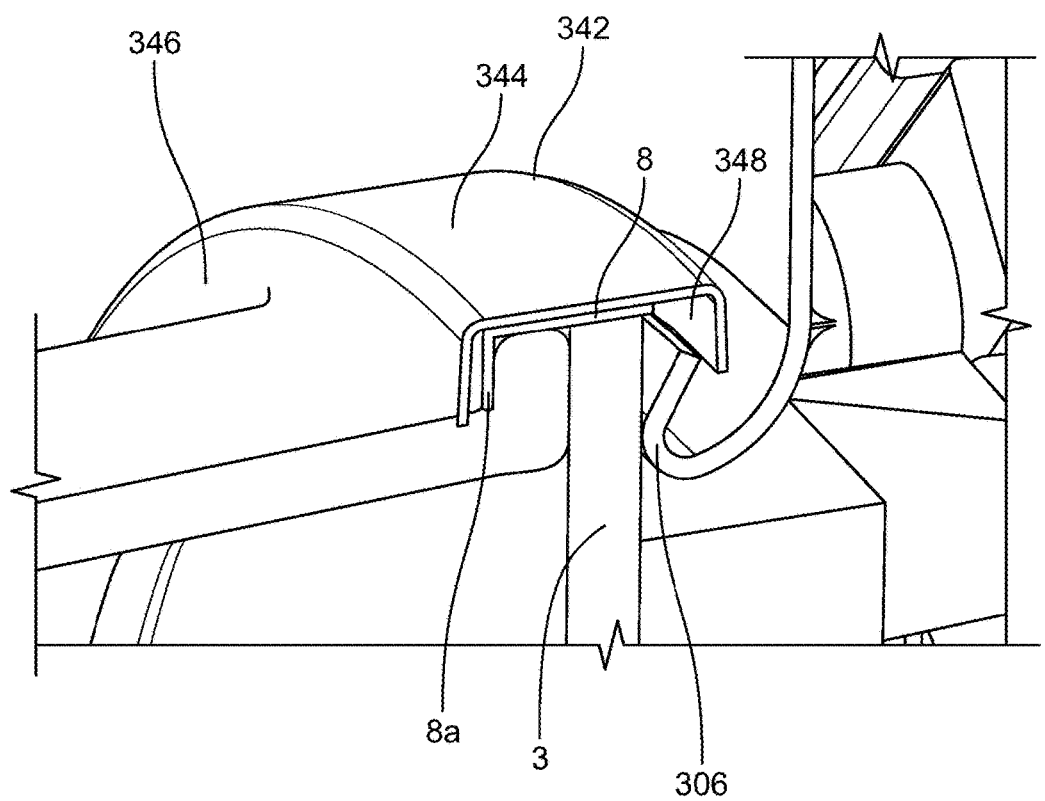
FIG. 15B is an enlarged cross-sectional view of the ring-type meter socket and installed meter shown in FIG. 15A showing the sealing ring retaining the meter in the meter socket.
Figure 16:
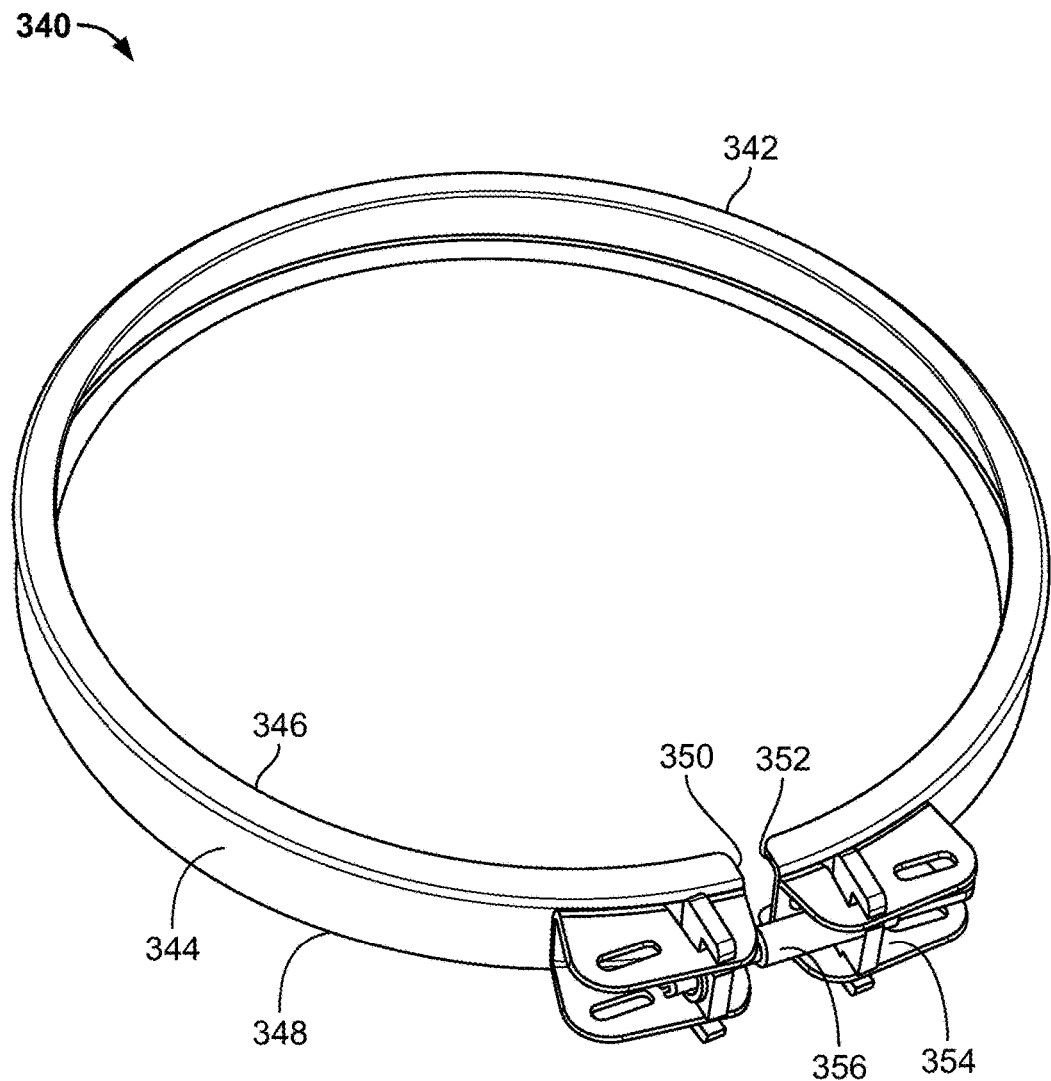
FIG. 16 is a perspective view of the sealing ring of the meter socket shown in FIG. 15A.

Referring to FIG. 15B, it can be seen that meter base 3 seats against curl 306 of cover 304 when meter 1 is installed within meter socket 300. Sealing ring 340 is then positioned over annular flange 8 of meter 1 such that front rim 346 of annular band 342 engages front rim 8a of annular flange 8 and back rim 348 of annular band 342 extends over the edge of curl 306. Electric power utility personnel then use a custom tool to tighten screw 356 of lock mechanism 354 causing annular band 342 to tighten and prevent unauthorized removal of cover 304 (and thus meter 1) from meter socket 300. Of course, if sealing ring 340 is removed, meter 1 can be removed from meter socket 10 without removal of cover 14 from meter socket enclosure 302.

Referring to FIGS. 19 and 20, meter socket 300 includes a first meter jaw block assembly 358 secured to the right riser wall and a second meter jaw block assembly 360 secured to the left riser wall. Each of meter jaw block assemblies 358 and 360 is structurally the same as meter jaw block assembly 60 (shown in FIG. 5) described above in connection with the first exemplary embodiment. As such, meter jaw block assemblies 358 and 360 will not be further described in connection with this second exemplary embodiment.

Meter socket 300 also includes a printed circuit board (not shown) that is the same as printed circuit board 122 described above in connection with the first exemplary embodiment. It should be understood that the printed circuit board functions as the tamper detection assembly of the second exemplary embodiment. Specifically, the printed circuit board includes a light sensor that is configured to detect tampering caused by an energy thief removing sealing ring 340 and meter 1 from meter socket 300 (as shown in FIG. 17) and potentially further removing cover 304 from meter socket enclosure 302 (as shown in FIG. 19). Either of these types of tampering would enable the energy thief to access the top U-shaped connectors of meter jaw block assemblies 358 and 360 and steal electricity before it is metered. Further, the printed circuit board includes an acoustic sensor that is configured to detect tampering caused by an energy thief drilling, cutting, hammering, bending or otherwise attempting to violate the integrity of meter socket enclosure 302 in an effort to access the top U-shaped connectors of meter jaw block assemblies 358 and 360 and steal electricity before it is metered. Of course, the printed circuit board could include just one of the light sensor or acoustic sensor without departing from the scope of the present invention and, additionally, could include other types of light sensors and acoustic sensors as described above.

It should also be understood that the printed circuit board is configured to enable communication with a paired receiver (not shown) using Near Field Communication (NFC), Bluetooth Low Energy, Advanced and Adaptive Network Technology (ANT), or other low power wireless point-to-point technology. In the second exemplary embodiment, the receiver is located inside meter 1 and is integrated with the meter's communication bus. When the printed circuit board transmits tamper data to the receiver, the receiver communicates the information to the meter's communication bus and the meter logs the tamper data and/or relays the tamper data to the electric power utility over the existing communication network. The tamper data may comprise a single bit to indicate a tamper event, or may comprise additional information such as the light level or sound level of the tamper event. Further, it is possible to provide two-way communication between the printed circuit board and receiver to enable the receiver to transmit data to the printed circuit board for the purpose of adjusting the light and/or sound tamper detection values or otherwise provide new programming to the microprocessor of the printed circuit board.

3. Third Exemplary Embodiment

Figure 22:
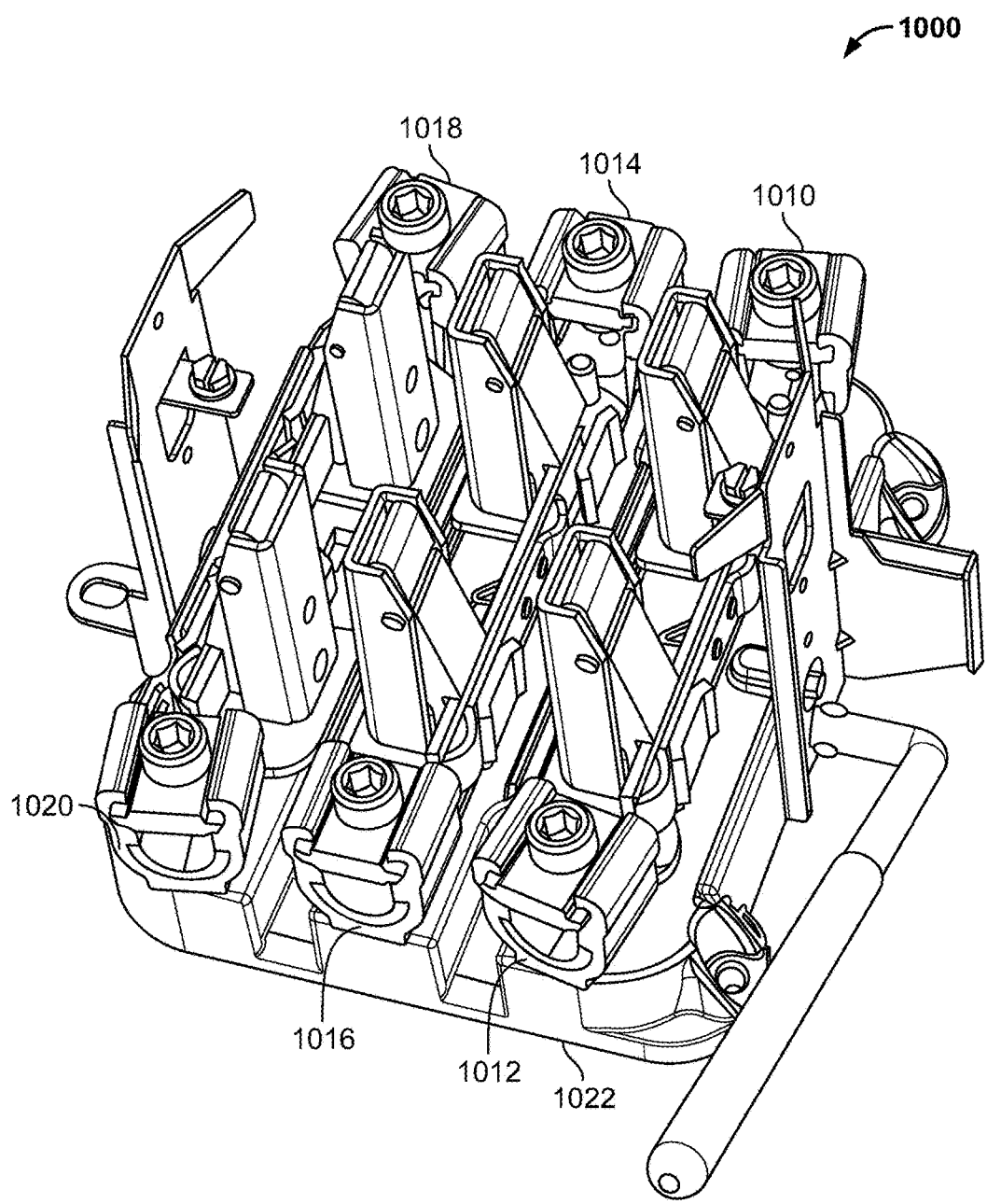
FIG. 22 is a perspective view of a meter socket of a three-phase power system in accordance with a third exemplary embodiment of the present invention.
Figure 23:
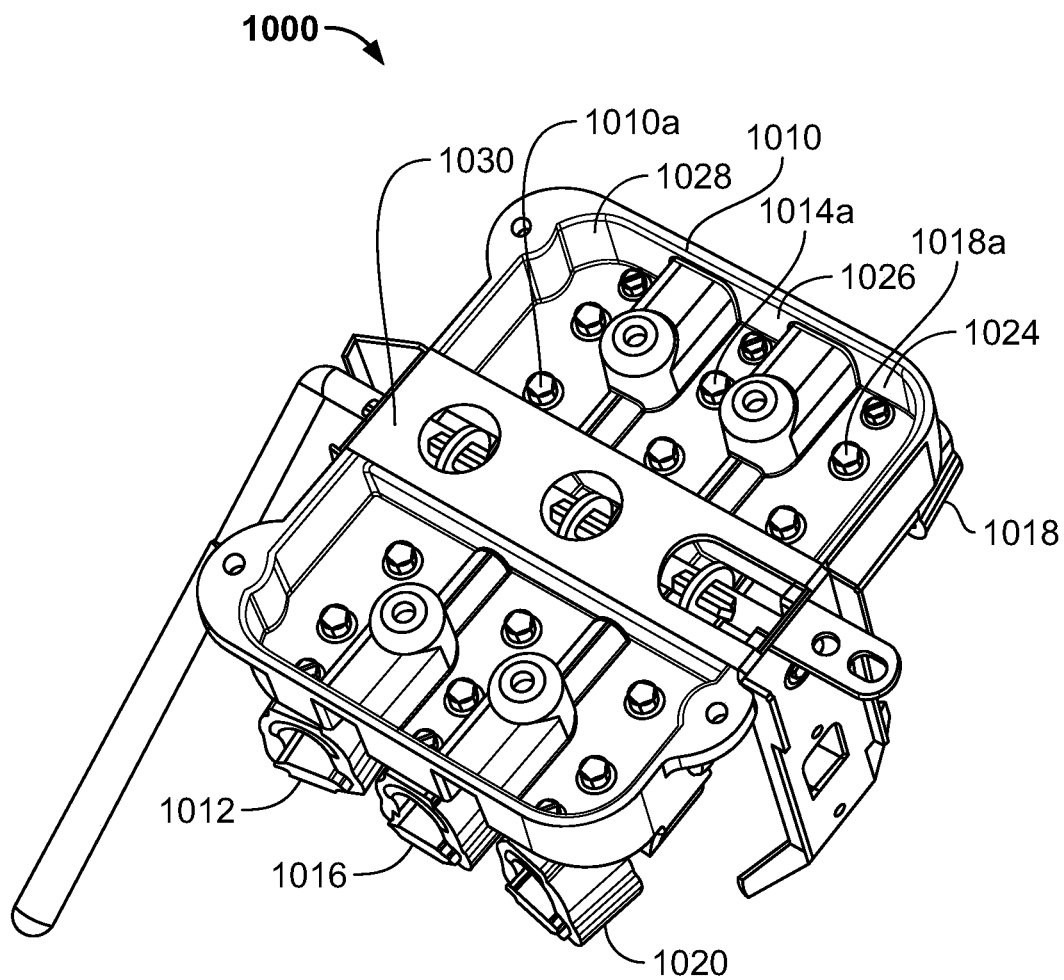
FIG. 23 is a perspective view of the back side of the meter socket shown in FIG. 22.

FIGS. 22 and 23 show a meter socket 1000 (without the enclosure) of a three-phase power system in accordance with a third exemplary embodiment of the present invention. Meter socket 1000 includes three pairs of electrical connectors—a first pair comprising a line side electrical connector 1010 and a load side electrical connector 1012, a second pair comprising a line side electrical connector 1014 and a load side electrical connector 1016, and a third pair comprising a line side electrical connector 1018 and a load side electrical connector 1020. It should be understood that electric utility power is provided at electrical connectors 1010, 1014 and 1018 and customer power is provided at electrical connectors 1012, 1016 and 1020. All three pairs of electrical connectors are mounted to an insulating mounting block 1022. One skilled in the art will understand that each of the three pairs of electrical connectors and associated mounting block 1022 are structurally similar to meter jaw block assembly 60 (shown in FIG. 5) described above in connection with the first exemplary embodiment, with the exception that there is no existing opening in mounting block 1022 (such as opening 120 in mounting block 68). Thus, an opening (not shown) must be formed in mounting block 1022 to provide line-of-sight access to a light sensor of a tamper detection assembly.

It should be understood that a printed circuit board (not shown) similar in function to printed circuit board 122 described above may function as the tamper detection assembly of the third exemplary embodiment. The printed circuit board may be mounted on the underside of mounting block 1022 within any one of the cavities marked as reference numbers 1024, 1026 and 1028 in FIG. 23. When assembled, a first spring contact on the printed circuit board contacts the applicable one of bolt heads 1018*a*, 1014*a* and 1010*a* of electrical connectors 1018, 1014 and 1010, respectively, so as to provide electric utility power to the tamper detection assembly. Also, a second spring contact on the printed circuit board contacts the metal bracket 1030 that bisects mounting block 1022, which is grounded, so as to provide a connection to electrical ground for the tamper detection assembly. As described above, the printed circuit board communicates with a paired receiver located inside an AMI meter installed within meter block 1000. The AMI meter then logs the tamper data and/or relays the tamper data to the electric power utility over the existing communication network.

4. Alternative Embodiments

One skilled in the art will appreciate that various modifications may be made to the first, second and third exemplary embodiments described above without departing from the scope of the present invention.

For example, the present invention may be utilized with meter sockets in which the tamper detection assembly (i.e., the printed circuit board) transmits the tamper data to the electric power utility over other types of communication networks (in which case the AMI meter is not required to relay the tamper data to the electric power utility). In some embodiments, the tamper detection assembly communicates with the electric power utility over any one of a variety of radio-frequency communication networks, such as CDMA (Code Division Multiple Access), GSM (Global System for Mobiles), Iridium or other satellite communications. In other embodiments, the tamper detection assembly communicates with the electric power utility using power line carrier communications or other means that use power lines to carry digital communication signals. Also, the tamper detection assembly may transmit data to the actual meter customer (i.e., the power user) using a low power communication method such as ZigBee or even using power line carrier communications. Virtually any form of wireless communication or power line carrier communication may be employed within the scope of the present invention.

As another example, the light and acoustic sensors provided on the tamper detection assembly may be incorporated into the AMI meter itself (as opposed to being mounted within the mounting block of the meter socket). In this case, the light sensor must view the area "behind" the meter, preferably in the center to avoid light that is transmitted through the transparent meter cover. Of course, in these embodiments, the AMI meter will not be able to transmit tamper data to the electric power utility if an energy thief has removed the meter from the meter socket (because the tamper detection assembly will not have a source of power). For this reason, positioning the tamper detection assembly within the mounting block of the meter socket is preferred insofar as that arrangement provides uninterrupted power to the tamper detection assembly, even if the meter is removed from the meter socket.

As yet another example, a variety of other types of electronic devices (not just a tamper detection assembly) may be positioned within the mounting block of the meter socket so as to have access to a secure source of power and communications, as described above. These electronic devices may include a wide variety of sensors, such as sensors that detect temperature, light, current, voltage, sound, vibration, or virtually any parameter of interest to the electric power utility or power user. These electronic devices may also detect signal characteristics of the power line (e.g., to detect arcing faults) or may even detect power usage patterns. All of these electronic devices require a source of power and the means to communicate information, which is provided by the unique location within the mounting block of the meter socket. Because an AMI meter reports loss of power to the electric power utility, and because the AMI meter must be removed to access the mounting block of the meter socket, any attempt to remove the mounting block would be reported to the electric power utility. Thus, mounting an electronic device within the mounting block of the meter socket provides a secure power connection insofar as the power and ground connections are inaccessible without detection.

5. General

The description set forth above provides several exemplary embodiments of the inventive subject matter. Although each exemplary embodiment represents a single combination of inventive elements, the inventive subject matter is considered to include all possible combinations of the disclosed elements. Thus, if one embodiment comprises elements A, B, and C, and a second embodiment comprises elements B and D, then the inventive subject matter is also considered to include other remaining combinations of A, B, C, or D, even if not explicitly disclosed.

The use of any and all examples or exemplary language (e.g., "such as") provided with respect to certain embodiments is intended merely to better describe the invention and does not pose a limitation on the scope of the invention. No language in the description should be construed as indicating any non-claimed element essential to the practice of the invention.

The use of relative relational terms, such as first and second, top and bottom, and left and right, are used solely to distinguish one unit or action from another unit or action without necessarily requiring or implying any actual such relationship or order between such units or actions.

The use of the terms "comprises," "comprising," or any other variation thereof, are intended to cover a non-exclusive inclusion, such that a system or method that comprises a list of elements does not include only those elements, but may include other elements not expressly listed or inherent to such system or method.

While the present invention has been described and illustrated hereinabove with reference to several exemplary embodiments, it should be understood that various modifications could be made to these embodiments without departing from the scope of the invention. Therefore, the present invention is not to be limited to the specific configurations or methodologies of the exemplary embodiments, except insofar as such limitations are included in the following claims.

What is claimed and desired to be secured by Letters Patent is as follows:

1. A meter socket, comprising:
a meter socket enclosure;
at least one meter jaw block assembly mounted within the meter socket enclosure, wherein the meter jaw block assembly comprises a line side electrical connector, a load side electrical connector, and an insulating mounting block configured to support the line side electrical connector and the load side electrical connector; and
a tamper detection assembly positioned within the insulating mounting block of the meter jaw block assembly, wherein a portion of the tamper detection assembly is in electrical contact with the line side electrical connector of the meter jaw block assembly so as to provide power to the tamper detection assembly, and wherein the tamper detection assembly is configured to detect a tamper event.

2. The meter socket of claim 1, wherein the tamper detection assembly comprises a transmitter configured to transmit tamper data associated with the tamper event to a receiver.

3. The meter socket of claim 2, wherein the receiver is located within a meter installed within the meter socket.

4. The meter socket of claim 3, wherein the transmitter communicates with the receiver using wireless point-to-point technology.

5. The meter socket of claim 2, wherein the receiver is located remote from the meter socket.

6. The meter socket of claim 5, wherein the transmitter communicates with the receiver over a radio-frequency communication network.

7. The meter socket of claim 5, wherein the transmitter communicates with the receiver using power line carrier communications.

8. The meter socket of claim 1, wherein the tamper detection assembly comprises a light sensor.

9. The meter socket of claim 8, wherein the tamper detection assembly comprises a microprocessor configured to receive a signal from the light sensor and detect tampering caused by at least one of removing a cover of the meter socket enclosure, removing a meter installed within the meter socket, or creating an opening in the meter socket enclosure.

10. The meter socket of claim 8, wherein the insulating mounting block defines an opening, and wherein at least a portion of the light sensor is positioned adjacent the opening so as to provide line-of-sight access to the light sensor.

11. The meter socket of claim 1, wherein the tamper detection assembly comprises an acoustic sensor.

12. The meter socket of claim 11, wherein the tamper detection assembly comprises a microprocessor configured to receive a signal from the acoustic sensor and detect tampering caused by at least one of drilling, cutting, hammering, or bending the meter socket enclosure.

13. A meter socket, comprising:
a meter socket enclosure;
at least one meter jaw block assembly mounted within the meter socket enclosure, wherein the meter jaw block assembly comprises a line side electrical connector, a load side electrical connector, and an insulating mounting block configured to support the line side electrical connector and the load side electrical connector;
an electronic device positioned within the insulating mounting block of the meter jaw block assembly, wherein a portion of the electronic device is in electrical contact with the line side electrical connector of the meter jaw block assembly so as to provide power to the electronic device.

14. The meter socket of claim 13, wherein the electronic device comprises a transmitter configured to enable communication with a receiver.

15. The meter socket of claim 14, wherein the receiver is located within a meter installed within the meter socket.

16. The meter socket of claim 15, wherein the transmitter communicates with the receiver using wireless point-to-point technology.

17. The meter socket of claim 14, wherein the receiver is located remote from the meter socket.

18. The meter socket of claim 17, wherein the transmitter communicates with the receiver over a radio-frequency communication network.

19. The meter socket of claim 17, wherein the transmitter communicates with the receiver using power line carrier communications.

20. The meter socket of claim 13, wherein the electronic device comprises one or more of a light sensor, an acoustic sensor, a temperature sensor, a current sensor, a voltage sensor, and a vibration sensor.

21. The meter socket of claim 13, wherein the electronic device comprises a tamper detection assembly configured to detect a tamper event.

22. A single-phase or three-phase power system, comprising:
   a meter socket;
   a meter installed within the meter socket; and
   a tamper detection assembly comprising (a) a light sensor, (b) an acoustic sensor, (c) a microprocessor configured to (i) receive a first signal from the light sensor, wherein a voltage value of the first signal provides an indication of a light level detected by the light sensor, (ii) receive a second signal from the acoustic sensor, wherein a voltage value of the second signal provides an indication of a sound level detected by the acoustic sensor, (iii) analyze the first and second signals to detect a tamper event, wherein the tamper event is detected when the voltage value of the first signal is greater than a preset light tamper detection value or when the voltage value of the second signal is greater than a preset sound tamper detection value, and (iv) generate tamper data associated with the tamper event, and (d) a transmitter configured to transmit the tamper data to a receiver.

23. The power system of claim 22, wherein the tamper detection assembly is located in the meter.

24. The power system of claim 22, wherein the tamper detection assembly is located in the meter socket.

25. The power system of claim 24, wherein the meter socket comprises:
   a meter socket enclosure;
   at least one meter jaw block assembly mounted within the meter socket enclosure, wherein the meter jaw block assembly comprises a line side electrical connector, a load side electrical connector, and an insulating mounting block configured to support the line side electrical connector and the load side electrical connector.

26. The power system of claim 25, wherein the tamper detection assembly is positioned within the insulating mounting block of the meter jaw block assembly, and wherein a portion of the tamper detection assembly is in electrical contact with the line side electrical connector of the meter jaw block assembly so as to provide power to the tamper detection assembly.

27. The power system of claim 25, wherein the insulating mounting block defines an opening, and wherein at least a portion of the light sensor is positioned adjacent the opening so as to provide line-of-sight access to the light sensor.

28. The power system of claim 24, wherein the receiver is located within a meter installed within the meter socket.

29. The power system of claim 28, wherein the transmitter communicates with the receiver using wireless point-to-point technology.

30. The power system of claim 24, wherein the receiver is located remote from the meter socket.

31. The power system of claim 30, wherein the transmitter communicates with the receiver over a radio-frequency communication network.

32. The power system of claim 30, wherein the transmitter communicates with the receiver using power line carrier communications.

33. The power system of claim 25, wherein the microprocessor is configured to detect tampering caused by at least one of removing a cover of the meter socket enclosure, removing the meter from the meter socket, or creating an opening in the meter socket enclosure.

34. The power system of claim 25, wherein the microprocessor is configured to detect tampering caused by at least one of drilling, cutting, hammering, or bending the meter socket enclosure.

35. A tamper detection assembly for a meter socket, comprising:
   a meter socket enclosure;
   at least one meter jaw block assembly mounted within the meter socket enclosure, wherein the meter jaw block assembly comprises a line side electrical connector, a load side electrical connector, and an insulating mounting block configured to support the line side electrical connector and the load side electrical connector;
   a printed circuit board configured to be positioned within the insulating mounting block of the meter jaw block assembly;
   a sensor positioned on the printed circuit board; and
   a microprocessor positioned on the printed circuit board, wherein the microprocessor is configured to receive a signal from the sensor, analyze the signal to detect a tamper event, and generate tamper data associated with the tamper event; and
   a transmitter positioned on the printed circuit board, wherein the transmitter is configured to transmit the tamper data to a receiver.

36. The tamper detection assembly of claim 35, further comprising an electrical contact positioned on the printed circuit board so as to contact the line side electrical connector of the meter jaw block assembly.

37. The tamper detection assembly of claim 35, wherein the insulating mounting block defines an opening, and wherein the sensor comprises a light sensor at least a portion of which is positioned on the printed circuit board adjacent the opening so as to provide line-of-sight access to the light sensor.

38. The tamper detection assembly of claim 35, wherein the receiver is located within a meter installed within the meter socket.

39. The tamper detection assembly of claim 38, wherein the transmitter communicates with the receiver using wireless point-to-point technology.

40. The tamper detection assembly of claim 35, wherein the receiver is located remote from the meter socket.

41. The tamper detection assembly of claim 40, wherein the transmitter communicates with the receiver over a radio-frequency communication network.

42. The tamper detection assembly of claim 40, wherein the transmitter communicates with the receiver using power line carrier communications.

43. The tamper detection assembly of claim 35, wherein the sensor comprises a light sensor, and wherein the microprocessor is configured to detect tampering caused by at least one of removing a cover of the meter socket enclosure, removing a meter from the meter socket, or creating an opening in the meter socket enclosure.

44. The tamper detection assembly of claim 35, wherein the sensor comprises an acoustic sensor, and wherein the microprocessor is configured to detect tampering caused by at least one of drilling, cutting, hammering, or bending the meter socket enclosure.

45. A single-phase or three-phase power system, comprising:
- a meter socket;
- a meter installed within the meter socket; and
- a tamper detection assembly comprising (a) a light sensor, (b) a microprocessor configured to (i) receive a signal from the light sensor, wherein a voltage value of the signal provides an indication of a light level detected by the light sensor, (ii) analyze the signal to detect a tamper event, wherein the tamper event is detected when the voltage value of the signal is greater than a preset light tamper detection value, and (iii) generate tamper data associated with the tamper event, and (c) a transmitter configured to transmit the tamper data to a receiver.

* * * * *